(12) United States Patent
Yan et al.

(10) Patent No.: US 12,057,558 B2
(45) Date of Patent: Aug. 6, 2024

(54) SYSTEM FOR DYNAMIC MANAGEMENT AND CONTROL OF LITHIUM BATTERY ENERGY STORAGE SYSTEM

(71) Applicant: SHANGHAI MAKESENS ENERGY STORAGE TECHNOLOGY CO., LTD., Shanghai (CN)

(72) Inventors: Xiao Yan, Shanghai (CN); Dongzheng Wang, Shanghai (CN); Pingchao Hao, Shanghai (CN)

(73) Assignee: SHANGHAI MAKESENS ENERGY STORAGE TECHNOLOGY CO., LTD., Shanghai (CN)

( * ) Notice: Subject to any disclaimer, the term of this patent is extended or adjusted under 35 U.S.C. 154(b) by 18 days.

(21) Appl. No.: 18/089,800

(22) Filed: Dec. 28, 2022

(65) Prior Publication Data

US 2023/0208178 A1 Jun. 29, 2023

(30) Foreign Application Priority Data

Dec. 28, 2021 (CN) .......................... 202111632231.0

(51) Int. Cl.
*H01M 10/052* (2010.01)
*G01R 31/374* (2019.01)
(Continued)

(52) U.S. Cl.
CPC .......... *H01M 10/44* (2013.01); *G01R 31/374* (2019.01); *G01R 31/389* (2019.01); (Continued)

(58) Field of Classification Search
CPC .. H01M 10/44; H01M 10/052; H01M 10/425; H01M 10/46; H01M 2010/4271; H01M 2010/4278; G01R 31/389; G01R 31/392; G01R 31/374; H02J 7/00032; H02J 7/0048; H02J 7/005; H02J 7/00712; H02J 7/0013

See application file for complete search history.

(56) References Cited

U.S. PATENT DOCUMENTS

| 2013/0184882 A1* | 7/2013 | Momose | B60L 53/68 700/286 |
| 2014/0312910 A1* | 10/2014 | Cho | G01R 31/3842 324/426 |
| 2020/0346558 A1* | 11/2020 | Luo | B60L 58/12 |

\* cited by examiner

*Primary Examiner* — Drew A Dunn
*Assistant Examiner* — Pamela J Jeppson
(74) *Attorney, Agent, or Firm* — Locke Lord LLP; Tim Tingkang Xia, Esq.

(57) ABSTRACT

The invention discloses a system for dynamic management and control of a lithium battery energy storage system and an electronic device. A battery management system (BMS) is configured to read a present operation data stream of each cell. A diagnosis apparatus is configured to extract a key battery parameter of said each cell from the present operation data stream and consistency thereof, compare the key battery parameter with historical data to determine whether a battery module fails, generate a control parameter according to a diagnosis result, and transmit the present operation data stream to an intelligent gateway and the control parameter to the BMS and an energy management system (EMS), to cause the EMS to dynamically change a charging/discharging control parameter for the battery energy storage system according to a present state of the battery energy storage system.

7 Claims, 17 Drawing Sheets

(51) Int. Cl.
  *G01R 31/389* (2019.01)
  *G01R 31/392* (2019.01)
  *H01M 10/42* (2006.01)
  *H01M 10/44* (2006.01)
  *H01M 10/46* (2006.01)
  *H02J 7/00* (2006.01)

(52) U.S. Cl.
  CPC ........ *G01R 31/392* (2019.01); *H01M 10/052* (2013.01); *H01M 10/425* (2013.01); *H01M 10/46* (2013.01); *H02J 7/00032* (2020.01); *H02J 7/0013* (2013.01); *H02J 7/0048* (2020.01); *H02J 7/005* (2020.01); *H02J 7/00712* (2020.01); *H01M 2010/4271* (2013.01); *H01M 2010/4278* (2013.01)

SYSTEM FOR DYNAMIC MANAGEMENT AND CONTROL OF LITHIUM BATTERY ENERGY STORAGE SYSTEM

CROSS-REFERENCE TO RELATED PATENT APPLICATION

This application claims priority to and the benefit of Chinese Patent Application No. 202111632231.0, filed Dec. 28, 2021, which is incorporated herein in its entirety by reference.

FIELD OF THE INVENTION

The present invention relates to the technical field of batteries, and in particular, to a system for dynamic management and control of a lithium battery energy storage system.

BACKGROUND OF THE INVENTION

At present, during energy storage of a lithium battery, charging and discharging for many times will cause the weakest battery cell to age much faster than expected by the manufacturer. The resulting serious consistency-related problems and potential safety hazards as a result of thermal runaways and internal short circuits are root causes of spontaneous combustions that have occurred in electric vehicles and energy storage power stations in recent years. For the development of the energy storage power station, it is necessary to provide an operable and rapid detection method to determine whether the power lithium battery module is safe during use. The spontaneous combustion of the lithium battery often originates from a cell of a single battery, and then it is required that detection should be performed on the cell. However, disassembling a lithium battery energy storage system is not allowed when strict outgoing detections are performed for cells.

Therefore, there is a need for a solution that can detect the status of each battery cell in the battery module online, and can realize the detection and diagnostic analysis of the battery module without disassembly.

SUMMARY OF THE INVENTION

In order to solve the above noted problems, one aspect of the present invention provides method and apparatus for dynamic management and control of a lithium battery energy storage system and an electronic device.

In one aspect, the present invention provides a system for dynamic management and control of a lithium battery energy storage system, including an energy management system (EMS), a battery management system (BMS), and a lithium battery.

The EMS is configured to control a lithium battery to charge/discharge when a charging instruction/discharging instruction is acquired; acquire battery data of each cell in the lithium battery in the charging/discharging process from the BMS; and detect and analyze the lithium battery based on the acquired battery data;

The BMS is configured to acquire the battery data of the lithium battery in the charging/discharging process of the lithium battery.

The lithium battery is configured to charge/discharge under the control of the charging instruction/discharging instruction transmitted by the EMS.

The present invention has the following advantageous effects:

1. According to the present invention, detection and diagnosis are realized without disassembly, and characteristic values of a battery such as a capacity and an internal resistance of a cell and consistency thereof may be automatically acquired during normal charging, discharging, and idling throughout an energy storage life cycle of the battery, so as to determine whether a sign of a micro-short circuit exists, and may also be obtained without affecting the normal charging/discharging operation of a battery energy storage system.
2. In addition to regular correction of the working condition during operation and maintenance, there is no need to arrange time for special detection of battery energy storage to determine whether the cell has reliability and safety hazards, and therefore the energy storage system can be kept in normal operation to the greatest extent.
3. The dynamic energy storage control apparatus provided in the present invention may cause a switch to control parameters corresponding to "sub-healthy" and "retired" states when potential reliability and safety hazards are detected, and may cause a recovery to control parameters corresponding to a normal state when a post-operation and maintenance automatic fast detection confirms that the battery may recover.

In order to make the above objectives, features, and advantages of the present invention more obvious and understandable, the following preferred embodiments are described below in detail with reference to the accompanying drawings.

BRIEF DESCRIPTION OF THE DRAWINGS

To describe the technical solutions in embodiments of the present invention or in the prior art more clearly, the following briefly describes the accompanying drawings required for describing the embodiments or the prior art. Apparently, the accompanying drawings in the following description show merely some embodiments of the present invention, and a person of ordinary skill in the art may derive other drawings from these accompanying drawings without creative efforts.

DETAILED DESCRIPTION OF THE INVENTION

The present invention is further illustrated below through embodiments, but the present invention is not limited to the scope of the embodiments.

In the following embodiments and examples, a maximum battery capacity of a cell of a lithium battery is 180 Ah.

Figure 1:
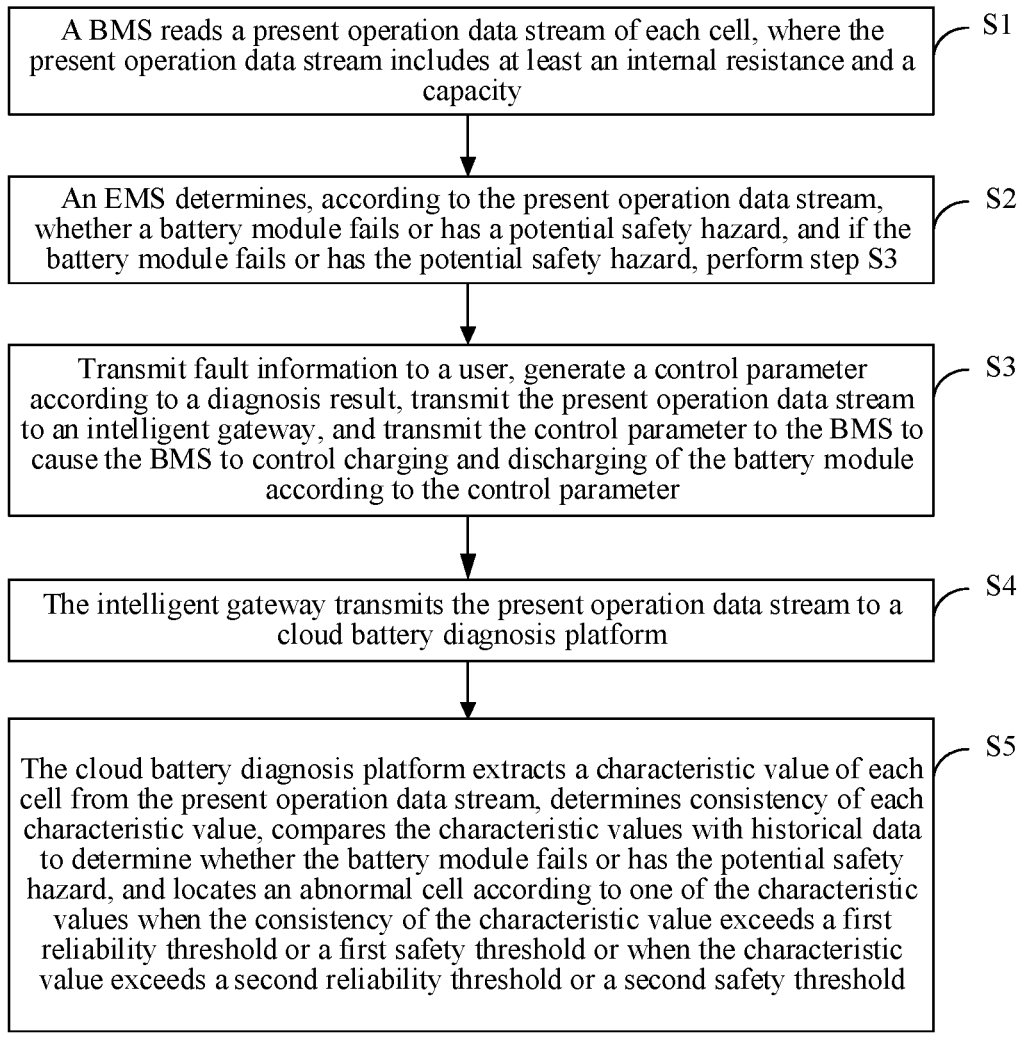
FIG. 1 is a flowchart of a dynamic management and control method for a lithium battery energy storage system according to an embodiment of the present invention.

The present invention provides a dynamic management and control method for a lithium battery energy storage system. The lithium battery energy storage system includes a battery module composed of a plurality of cells connected in series and/or in parallel and a battery management system (BMS). Referring to FIG. 1, the dynamic management and control method for a lithium battery energy storage system according to an embodiment of the present invention includes the following steps.

S1: The BMS reads a present operation data stream of each cell, where the present operation data stream includes at least an internal resistance and a capacity.

S2: An energy management system (EMS) determines, according to the present operation data stream, whether a battery module fails or has a potential safety hazard, and if so, step S3 is performed.

S3: Transmit fault information to a user, generate a control parameter according to a diagnosis result, transmit the present operation data stream to an intelligent gateway, and transmit the control parameter to the BMS to cause the BMS to control charging and discharging of the battery module according to the control parameter.

S4: The intelligent gateway transmits the present operation data stream to a cloud battery diagnosis platform.

S5: The cloud battery diagnosis platform extracts an characteristic value of each cell from the present operation data stream, compares consistency of each characteristic value, compares the characteristic values with historical data to determine whether the battery module fails or has the potential safety hazard, and locates an abnormal cell according to one of the characteristic values when the consistency of the characteristic value exceeds a first reliability threshold or a first safety threshold or when the characteristic value exceeds a second reliability threshold or a second safety threshold.

The dynamic management and control method of the present invention may be realized based on the dynamic management and control system of the lithium battery energy storage system. During specific implementation, the dynamic management and control system of the lithium battery energy storage system may include the EMS, the battery energy storage system, the intelligent gateway, and the cloud battery diagnosis platform performing two-way communication with the intelligent gateway, and the dynamic management and control system can be used to correspondingly realize the above dynamic management and control method.

The first reliability threshold and the second reliability threshold define a boundary between a normal state and a sub-healthy state of the lithium battery energy storage system, and the first safety threshold and the second safety threshold define a boundary between the sub-healthy state of the lithium battery energy storage system and a state with potential safety hazards requiring retirement. The charging/discharging control parameter of the normal state, the sub-healthy state, and the retired state satisfy the following relations: $I_{normal} \geq I_{sub\text{-}healthy} \geq I_{retired}$, $V_{max\ normal} \geq V_{max\ sub\text{-}healthy} \geq V_{max\ retired}$, $V_{min\ normal} \leq V_{min\ sub\text{-}healthy} \leq V_{min\ retired}$, where $I_{normal}$, $I_{sub\text{-}healthy}$, and $I_{retired}$ respectively represent charging/discharging currents of the normal state, the sub-healthy state, and the retired state; $V_{max\ normal}$, $V_{max\ sub\text{-}healthy}$, and $V_{max\ retired}$ respectively represent charging voltage thresholds of the normal state, the sub-healthy state, and retired state, $V_{min\ normal}$, $V_{min\ sub\text{-}healthy}$, and $V_{min\ retired}$ respectively represent discharging voltage thresholds of the normal state, the sub-healthy state, and the retired state.

For example, the battery energy storage system may be formed by n cells (cells) connected in series to form a module, then m cascades are connected in series to form a cluster, and j clusters are connected in parallel to form the whole energy storage system, in addition to an energy storage BMS composed of one BMS master controller, j battery cluster BMS middle-level controllers, and m*j BMS slave controllers. Each cluster BMS middle-level controller determines, based on whether a corresponding cluster is turned on or turned off, whether the cluster participates in a charging/discharging process of the entire battery pack as well as a charging/discharging current, and at the same time transmits an instruction to BMS slave controllers of a module under the control of the manager to ensure that a voltage of each cell is within a fixed range during charging/discharging, that is, $V_{min} < V_i < V_{max}$, where $i = 1, 2, \ldots,$ and n. $V_{min} > V_{mini}$, $V_{max} < V_{maxi}$, $V_{mini}$, and $V_{maxi}$ are respectively discharging and charging voltage thresholds of the lithium battery in the initial normal state. A master positive terminal and a master negative terminal of the battery are connected to the total positive and negative of an energy converter.

Figure 2:
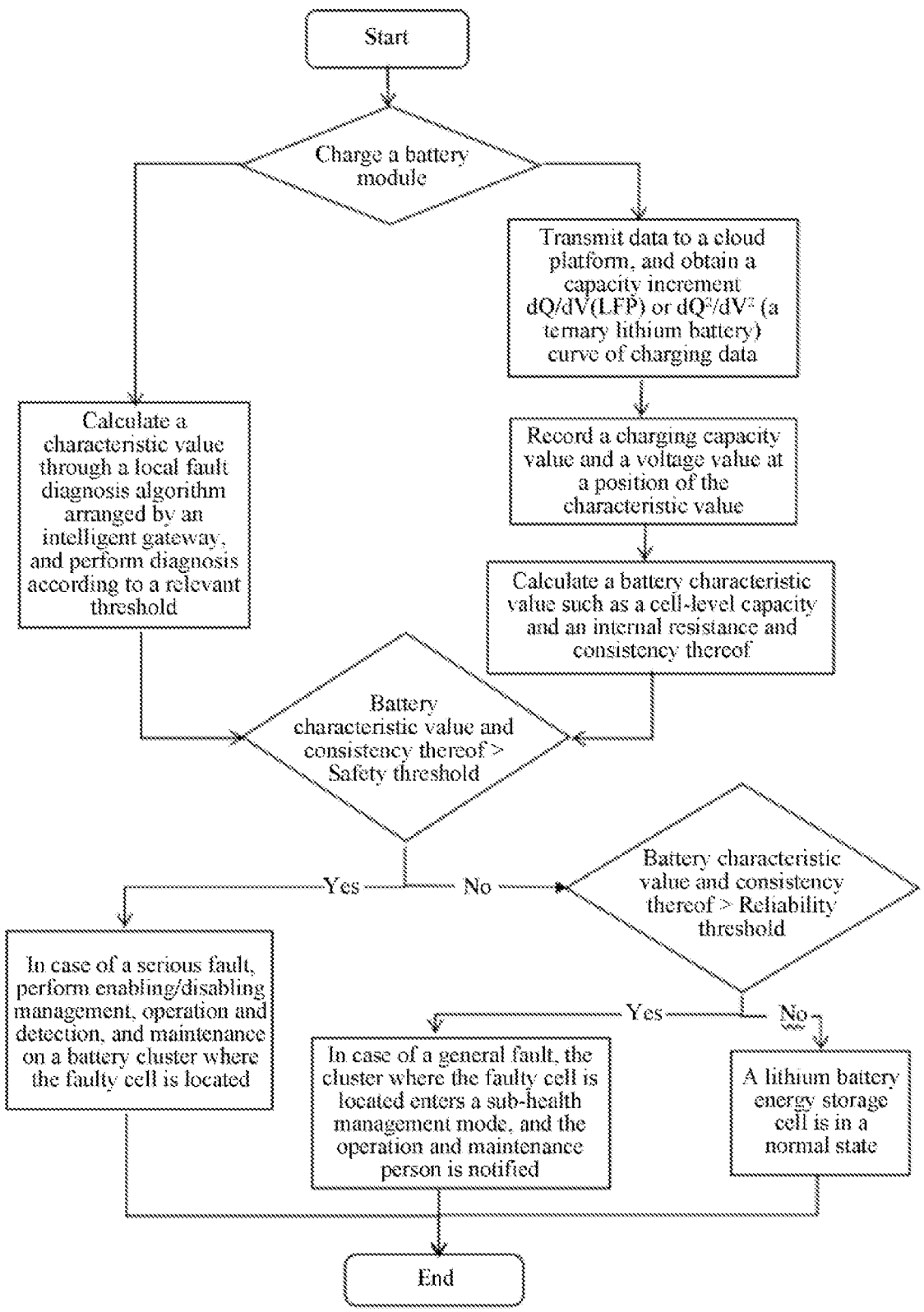
FIG. 2 is a schematic diagram of a dynamic management and control process of a battery module according to an embodiment of the present invention.

Referring to FIG. 2, by using the above control method, the detection and diagnosis of the whole life cycle of battery energy storage can be realized without disassembly. During the charging/discharging of the whole battery pack energy storage system, the BMS master controller and the energy converter perform two-way communication through the agreement of the industry, that is, exchange information through a CAN or Modbus. During the charging, the BMS master controller not only determines, by using a real-time fault diagnosis method for the present operation data stream obtained from the BMS, whether the battery pack fails or has a potential safety hazard, and but also transmits the data stream to the cloud battery diagnosis platform through the intelligent communication gateway. The cloud battery diagnosis platform extracts battery characteristic values such as an internal resistance and a capacity from the data stream of the cell, and diagnoses the potential safety hazard of the battery pack and locates the faulty cell by comparing the consistency of the characteristic values and historical data thereof. When the present operation value of the battery characteristic value or the consistency of the battery characteristic values exceeds the reliability and safety threshold, and an alarm instruction is issued, the BMS master controller or cloud platform automatically places an order to the maintenance or operation inspection person through the EMS, requires the person to carry out further offline operation inspection and maintenance according to the preset operation inspection rules and intelligent maintenance regulations. In addition, the BMS master controller transmits an instruction to dynamically change a charging/discharging current I of a battery cluster in which the faulty cell is found and control thresholds $V_{min}$ and $V_{max}$ for a charging/discharging voltage of the faulty cell, so as to ensure that the potential safety hazard of the cell is effectively controlled before offline operation inspection, thereby controlling potential safety hazards through intelligent dynamic adjustment of BMS control parameters without manual intervention and restoring the control threshold for the normal state after intelligent maintenance. For example, when a certain characteristic value or the consistency of a certain characteristic value exceeds the safety threshold, it is considered that a serious fault exists, and it is necessary to perform enabling/disabling management on the battery cluster where the faulty cell is located. In case of a general fault, a sub-health management mode is confirmed, and an operation and maintenance person is notified to solve the fault.

Specifically, the DC internal resistance is calculated according to the real-time voltage data of the cell and $R=(u_1-u_2)/I$, and it is determined, depending on whether the DC internal resistance is greater than the second reliability threshold of the internal resistance and the second safety threshold of the internal resistance, whether the general fault and a serious fault exist. $u_1$ is a voltage value at the beginning of charging or discharging, and $u_2$ is a voltage value during idling before charging. However, the second reliability threshold of the internal resistance and the second safety threshold of the internal resistance are determined according to a variation law of characteristic values of lithium batteries of the same kind and the same batch in the aging process. Preferably, the second reliability threshold of the internal resistance and the second safety threshold of the internal resistance are respectively 1.5-2 times and 4.5-5 times of the initial internal resistance of the cell.

Specifically, the EMS is configured to determine, depending on whether a range between the maximum voltage and the minimum voltage of the battery module is greater than a range threshold, whether the battery module fails or has potential safety hazards. A range=a charging current*an internal resistance threshold $\pm V_{set\ value}$, where $V_{set\ value}$ is a parameter reflecting the consistency of the battery module, which represents a battery pressure difference that is reflected when self-discharge and the SOC of the battery module are inconsistent when the lithium battery energy storage system is in normal operation.

In addition, the EMS is configured to determine, depending on whether the voltage of each cell is lower than a third threshold with an increase of the SOC in the charging process of the battery module, whether the battery module fails or has potential safety hazards.

In the charging process, the BMS is configured to extract the internal resistance and the capacity from the data stream in the following ways: a differential change dQ/dV of the SOC $Q=\int Idt$ of the cell i with the voltage is obtained from the data stream of the cell, and when dQ/dV reaches the maximum value, $V_{imax}$ is an equivalent voltage platform of the cell i, and the internal resistance of the cell is $R_i=(V_{imax}-OCV_i)/I$, where I is the charging current and $OCV_i$ is an open-circuit voltage (OCV). The capacity of the cell is $Q_i=\Delta Q_i/\Delta SOC_i$, where $\Delta Q_i$ is a capacity difference between the first peak and the largest peak of the dQ/dV curve, $\Delta SOC_i$ is an SOC difference between the two peaks, and $Q_i$ is the maximum capacity during full charging. Data satisfying the condition of $\Delta V \geq X$ is recorded in the charging process of the battery module, the characteristic value is determined according to $$\frac{dQ}{dV} = \frac{\Delta Q_k}{\Delta V_k} = \frac{Q_k - Q_{k-1}}{V_k - V_{k-1}},$$

and the charging capacity at a corresponding point of the characteristic value is recorded, where Q is the charging capacity of the battery, dQ is the differential of the capacity, $\Delta Q_k$ is a difference between capacities between adjacent sampling points, V is the voltage of the battery, dV is the differential of the voltage, $\Delta V_k$ is a difference between voltages between adjacent sampling points. For each sampling point k, $\Delta Q_k=Q_k-Q_{k-1}$ and $\Delta V_k=V_k-V_{k-1}$, where a value range of X is 1 mV$\leq$X$\leq$10 mV.

The second reliability threshold and the second safety threshold of the internal resistance, the capacity, and the OCV are obtained through a correction by applying an HPPC working condition. The EMS is configured to calculate the internal resistance of the cell i corresponding to each SOC value based on a difference $\Delta Vi$ between a front end voltage and a rear end voltage of the pulse, so as to obtain an R-SOC curve and an OCV-SOC curve of the cell i, and calculate, according to a total charging time minus an idle time and a pulsing time in the whole process, an effective capacity C of the whole battery module determined by the cell that earliest reaches the charging ending voltage. The corrected second reliability threshold and second safety threshold are values before correction multiplied by any value in [0.8, 1.2].

The EMS is configured to stop for a first time period upon completion of HPPC test and correction, record a second time period and the OCV at both ends of each cell during the second time period, calculate $\Delta OCV=OCV_{second\ time\ period}-OCV_{first\ time\ period}$, and compare the calculated result with the second reliability threshold and the second safety threshold of the voltage difference provided by the manufacturer to determine whether a problem exists in the self-discharge rate, where the second time period is shorter than the first time period.

In addition, the EMS has a two-way communication function with encryption, and is configured to transmit an instruction according to a preset rule to dispatch electric energy through an energy conversion device. The energy conversion device includes an AC-DC converter, an inverter, a bidirectional inverter, or a DC-DC converter.

The BMS is further configured to store a maximum transient discharging current, a continuous charging/discharging current, a charging/discharging voltage threshold of the cell, and a charging/discharging voltage threshold of the battery module. Initial values and present control values of the parameters satisfy that: a present current threshold≤an initial current threshold, a present charging voltage threshold≤an initial charging voltage threshold, and a present discharging voltage threshold≥an initial discharging voltage threshold. The BMS is configured to regularly acquire a control parameter from the intelligent gateway and perform updating. The BMS is configured to determine, according to the maximum power or/and total energy demands of the lithium battery energy storage system for charging or discharging and the present SOC of each cell of the lithium battery energy storage system, a charging or discharging current and a time interval and a voltage threshold for charging or discharging of each battery cluster under the control of the BMS, and the BMS is configured to perform balancing when the battery voltage consistency exceeds the preset threshold according to the preset rule. The battery cluster is composed of all battery modules connected in series and parallel.

The intelligent gateway is integrated in the EMS or the BMS. The intelligent gateway is configured to store a fault code, fault information, and a charging/discharging control parameter. The fault information includes serious fault information and general fault information. The serious fault information includes a sign of a micro-short circuit, thermal runaway, insulation abnormality, overheating, and communication abnormality, and the characteristic value or the consistency parameter of the battery is equal to or exceeds the safety threshold. The general fault information includes battery undervoltage, battery overvoltage, a low SOC, a high SOC, a balance fault, and the characteristic value or the consistency parameter of the battery exceeding the reliability threshold but less than the safety threshold.

The cloud battery diagnosis platform determines the variation trend of battery characteristic values such as the DC internal resistance, the capacity, and the SOC and consistency thereof with time based on the data analysis of historical data of each cell or the cell voltage, establishes a model describing the variation of the battery characteristic values and the consistency thereof with time, and predicts times at which present values thereof are to reach the second reliability threshold, the second security threshold, the first reliability threshold, and the first security threshold in the future. According to the position of the battery characteristic value and the consistency thereof relative to the second reliability threshold, the second safety threshold, the first reliability threshold, and the first safety threshold, the BMS is configured to automatically adjust the charging/discharging control parameter according to the following ways to ensure that the charging/discharging control parameter of the system can guarantee that the safety and the life of the system are not affected before the operation and maintenance. When the battery characteristic value exceeds the second reliability threshold but is less than the second security threshold and the consistency thereof exceeds the first reliability threshold but is less than the first security threshold and corresponds to the sub-healthy state, the BMS sets the maximum transient and continuous charging/discharging current $I_{sub-healthy}=\alpha*I_{normal}$ of the cell. The value of $\alpha$ is between 0.5 and 0.9, and the charging voltage control parameter $V_{max\ sub-healthy}=k_c V_{max\ normal}$. A value of $k_c$ causes the SOC to be between 80% and 95%, and the discharging voltage control parameter $V_{min\ sub-healthy}=k_d V_{min\ normal}$, where a value of $k_d$ causes the SOC to be between 5% and 20%. When the battery characteristic value is greater than the second safety threshold and the consistency thereof is greater than the first safety threshold and corresponds to the retired state, the BMS sets the maximum transient and continuous charging/discharging current $I_{retired}=\alpha'*I_{normal}$, where $\alpha'<\alpha$, the charging voltage control parameter $V_{max\ retired}=k_c' V_{max\ normal}$, where a value of $k_c'$ causes the SOC to be between 65% and 80%, $k_c'<k_c<1$, and the discharging voltage control parameter $V_{min\ sub-healthy}=k_d' V_{min\ normal}$, where a value of $k_d'$ causes the SOC to be between 20% and 35%, and kd'>kd>1. After the implementation of operation and maintenance, the dynamic management and control system is automatically adjusted to the sub-healthy state when the serious fault information disappears but the general fault information still exists, and the system returns to the normal operation state when the general fault information also disappears.

Specifically, the values of the current control parameter $\alpha$ in the sub-healthy state are between $(R_i/R_{max})^{1/2}$ and $R_i/R_{max}$, where $R_i$ and $R_{max}$ respectively represent the initial internal resistance of the cell and the present maximum internal resistance of the cell.

The technical solution of the present invention is further described below by using several application examples.

Example 1

Figure 3:
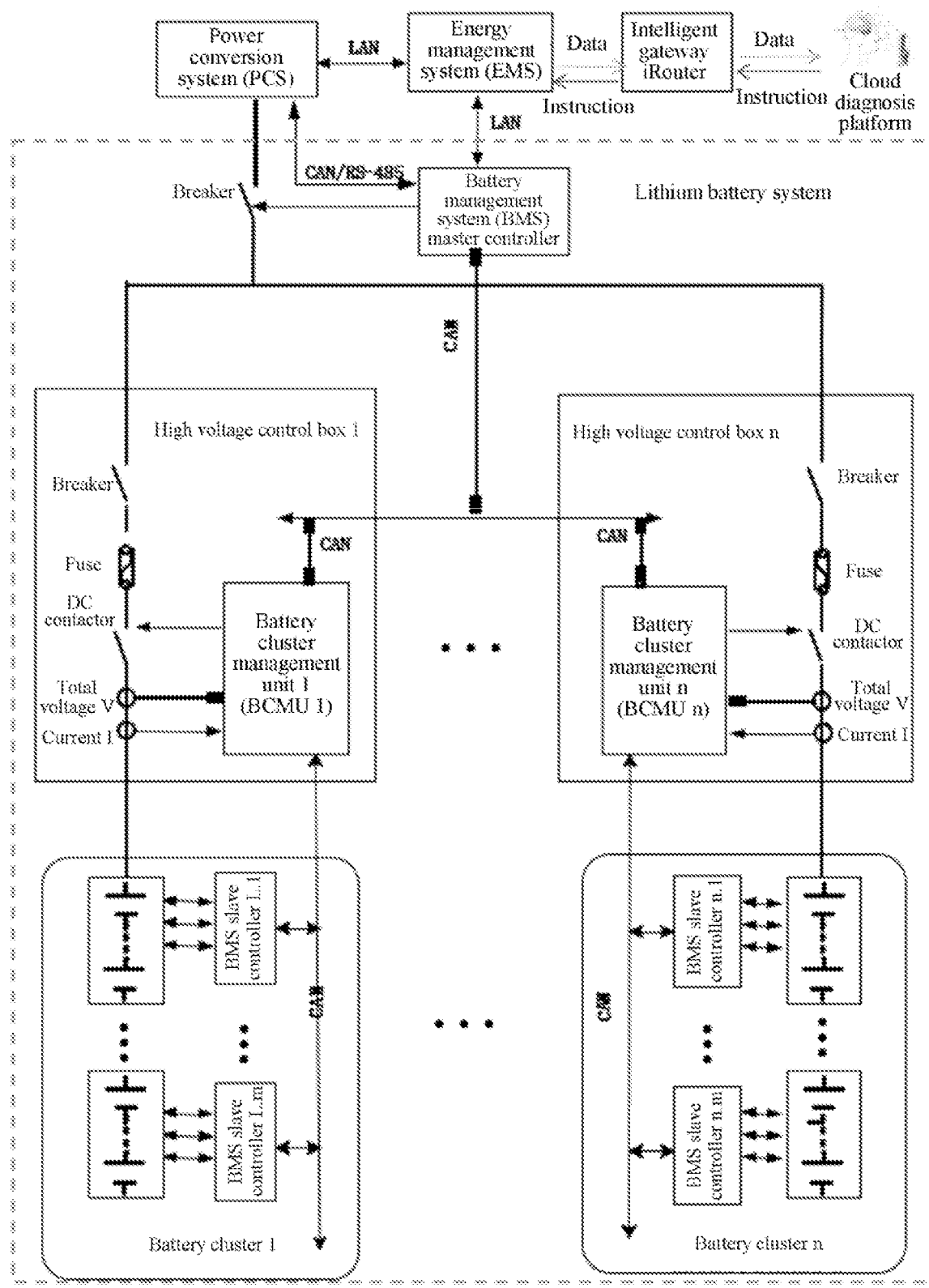
FIG. 3 is a structural block diagram of a dynamic management and control system of Example 1.

Small and medium-sized lithium iron phosphate batteries are used step by step as building energy storage by way of example (FIG. 3). The dynamic management and control apparatus includes a battery energy storage system master controller EMS, a power conversion system (PCS), a battery energy storage system, an intelligent gateway iRouter, and a cloud battery diagnosis platform performing two-way communication with the dynamic management and control apparatus. The battery energy storage system includes n (=10) battery clusters. Each cluster includes 6 modules. Each module includes 24 cells with an initial capacity of 60 Ah, an energy storage battery pack formed by 3.2 V batteries retired from the State Grid connected in series, and a three-level BMS that manages the cluster.

The EMS transmits a charging/discharging instruction to the PCS to realize a charging or discharging operation. In the process of charging/discharging, the three-level BMS collects data of the battery pack. The collected data includes a total charging/discharging current (of the battery pack), a total voltage of the battery pack, a current flowing through each battery cluster, and a charging/discharging voltage of a cell (that is, a cell in each battery cluster). In addition, through comparison of the currently acquired voltage and current with the key charging/discharging control parameter stored in the memory, the charging/discharging control parameter includes the total maximum transient and continuous charging/discharging current through each battery cluster, a total charging/discharging voltage threshold of the cell, and the like. If any of the present total charging/discharging currents through each cluster and the total voltage of the battery pack or the voltage of the cell exceeds the threshold of the key control parameter of the BMS master controller, the BMS master controller gives an alarm and cuts off the current for safety protection of the battery pack. The BMS master controller determines, according to the maximum power or/and total energy demands for charging or discharging of the battery pack by the system master controller EMS and the present SOC of each cell of the battery cluster obtained from the middle-level controller (a battery cluster management unit in FIG. 3) of each cluster BMS, the present charging or discharging current and a time interval and a threshold for charging or discharging of each battery cluster under the control of the BMS, and the BMS slave controller in the cluster is configured to perform balancing when the battery voltage consistency exceeds the preset threshold according to the preset rule.

The diagnostic cloud platform acquires the historical data of each cell from the three-level BMS master controller (BMS master control) through the intelligent gateway iRouter, and analyzes the data, determines the characteristic values such as a DC internal resistance, a capacity, and a self-discharge rate of each cell and the variation trend of the characteristic values with time from the data, and establishes a model describing the variations of the characteristic values with time to predict the future development trend of the characteristic values. According to the aging process of this kind of lithium iron phosphate battery, it is found that the reliability threshold of the internal resistance of the battery is 6 mΩ and the safety threshold is 13 mΩ. In addition, the DC internal resistance may be calculated according to the real-time data of the cell and the corresponding formula $$R = \frac{U_1 - U_2}{I}.$$

Figure 4:
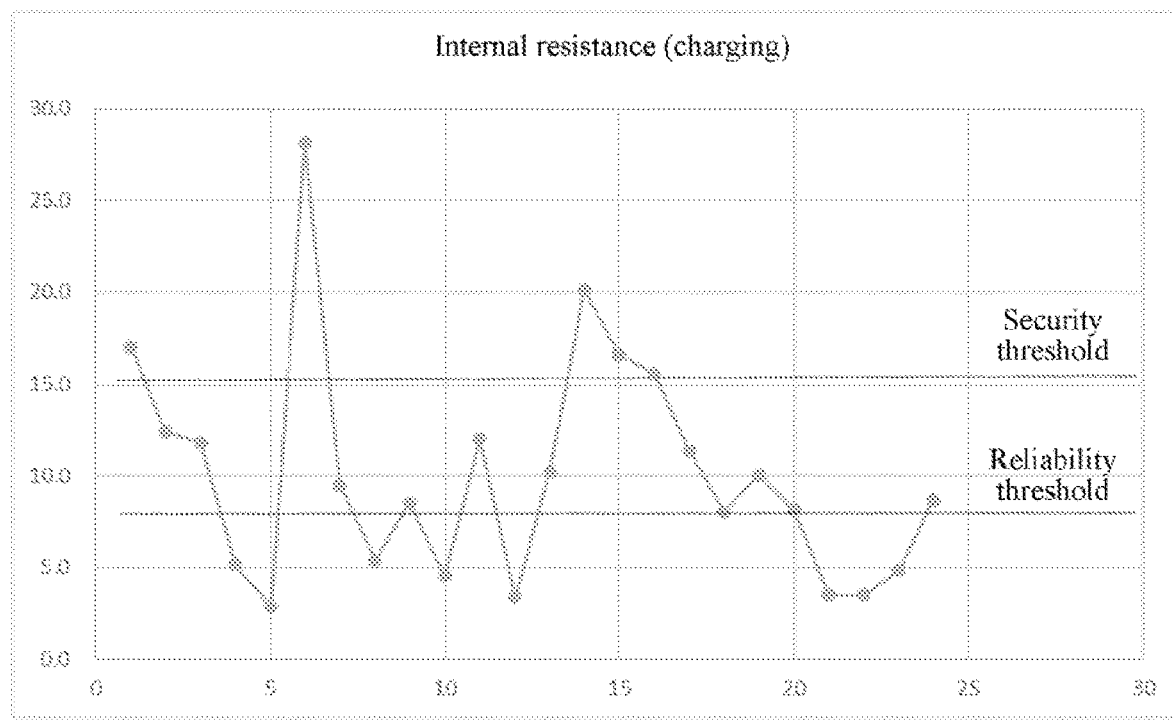
FIG. 4 shows a DC internal resistance value of a retired lithium iron phosphate battery module in Example 1 and corresponding reliability and safety thresholds.

$U_1$ is the voltage value at the beginning of charging, $U_2$ is the voltage value during idling before charging ($U_1$ and $U_2$ are the data acquired from the BMS master control). The present DC internal resistance of the cell is compared with the DC internal resistance value in the specification of the cell to diagnose the cell. FIG. 4 shows the DC internal resistance data of the second retired lithium iron phosphate battery box in the battery cluster 1. Referring to FIG. 4, only cells 4, 5, 8, 10, 21, 22, and 23 of the 24 cells are "normal", cells 2, 3, 7, 9, 11, 13, 17, 18, 19, 20, and 24 are in a "sub-healthy" state and have potential reliability hazards, while the internal resistance of cells 1, 3, 14, 15, and 16 exceeds the safety threshold value of 13 mΩ, and the cells are in a state of a serious fault with "potential safety hazards" and needing to be retired again (only cells with the serious fault are marked in FIG. 5). Assuming that the cells 1, 3, 14, 15, and 16 with the serious fault do not exist, but only the general alarm of the sub-healthy state exists, the parameter such as the maximum charging/discharging current may be dynamically corrected to a current value between 0.5 and 0.9 of the original value, so as to achieve intelligent dynamic adjustment of the BMS control parameter. In addition, the master controller EMS of the system automatically places an order to the maintenance or operation inspection person, so that a sub-healthy cell can carry out further offline operation inspection and maintenance as soon as possible according to the preset operation inspection rules and intelligent maintenance regulations, so as to prevent a situation such as excessive temperature rise during battery charging/discharging. Since the cell with the serious fault exists (that is, the cell with "potential safety hazards" that needs to be retired again), a battery cluster management unit (BCMU) of a battery cluster 1 receives an instruction to disconnect the circuit breaker for enabling/disabling management, and instructs the operation and maintenance person to perform operation inspection and maintenance as soon as possible.

Figure 5:
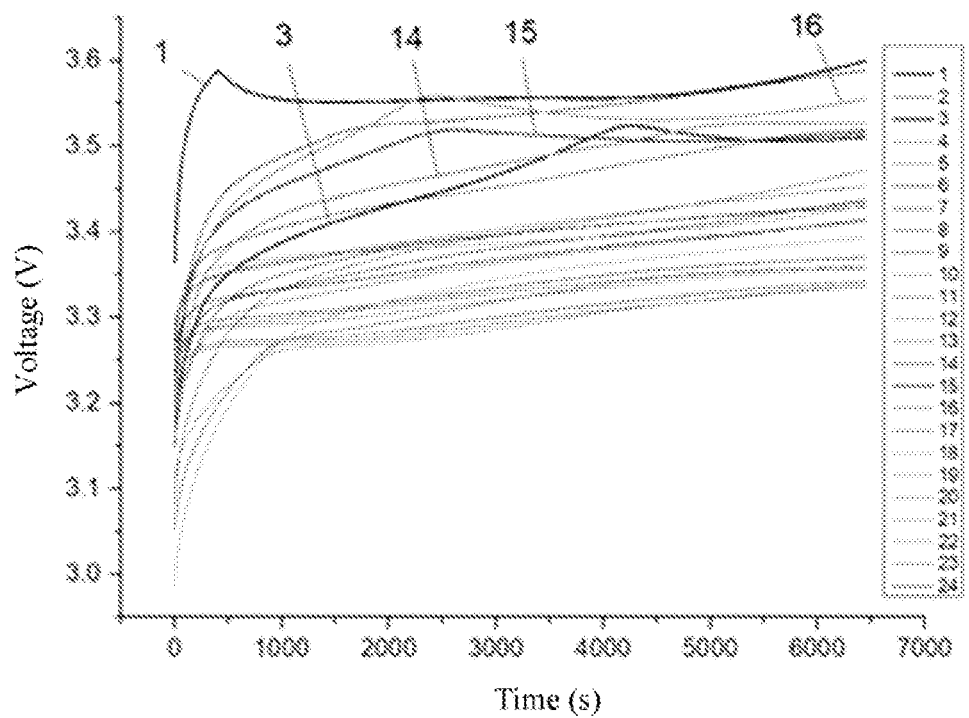
FIG. 5 shows a charging voltage curve of the retired lithium iron phosphate battery module in Example 1, where a serious fault phenomenon of voltage drops in cells 1, 3, 14, 15, and 16 during charging and corresponding to a sign of a micro-short circuit exists.
Figure 6:
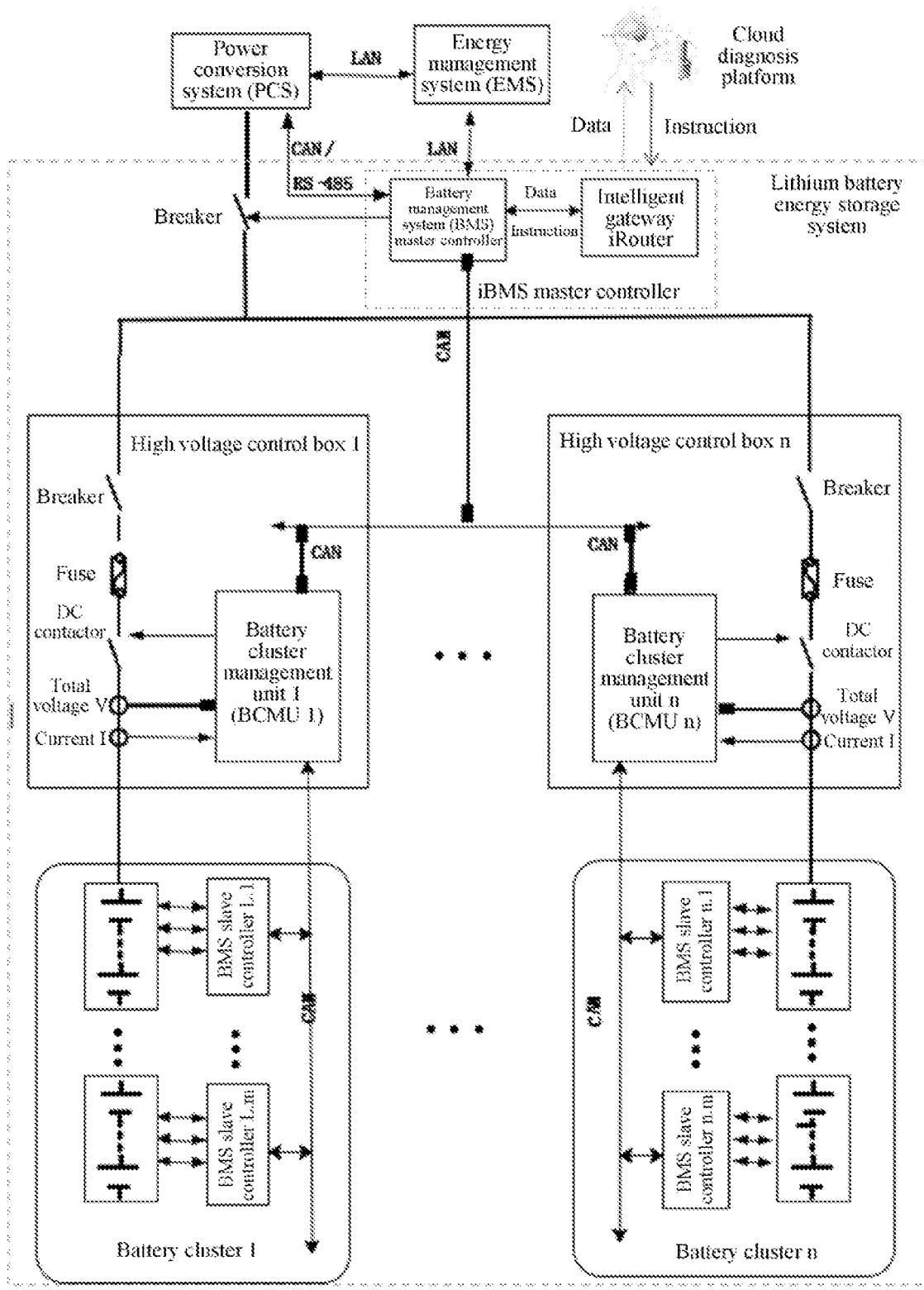
FIG. 6 is a schematic diagram of a dynamic management and control system of a container energy storage power station in Example 2 in the whole life cycle, which is composed of a power conversion system (PCS), a battery energy management system master controller EMS, a battery energy storage system, an intelligent battery management system (iBMS) master controller with an intelligent gateway function, and a cloud battery diagnosis platform that performs two-way communication with the intelligent gateway.

During processing of the charging data, once a situation that voltages of cells 1, 3, 14, 15, and 16 do not increase but decrease and the accumulated decreased value exceeds 30 mV (as shown in FIG. 5) is detected, it is determined that the several cells have "a sign of a micro-short circuit" and are in a state of "having potential safety hazards" and needing to be retired again, and then the BCMU1 is instructed to perform enabling/disabling management for the battery cluster 1. Data may be processed in the BMS, the intelligent gateway, or the diagnostic cloud platform.

Example 2

A container energy storage power station is used as an example. Referring to FIG. 6 to FIG. 14, in this case, the dynamic management and control apparatus is composed of a PCS, a battery energy storage system master controller EMS, a battery energy storage system, an iBMS master controller integrated with the intelligent gateway iRouter function and the BMS master controller, and a cloud battery diagnosis platform that performs two-way communication with the iBMS master controller. The battery energy storage system includes n battery clusters. Each cluster includes 240 cells, an energy storage battery pack formed by lithium iron phosphate batteries of 180 Ah and 3.2 V connected in series, and a three-level BMS that manages the cluster. The battery reference curve data is SOC-OCV relation curve data, and a data interval is $\Delta SOC=2\%$. The capacity value corresponding to each OCV point in each cluster is calculated by using the formula: Q=SOC*180 Ah.

Figure 7:
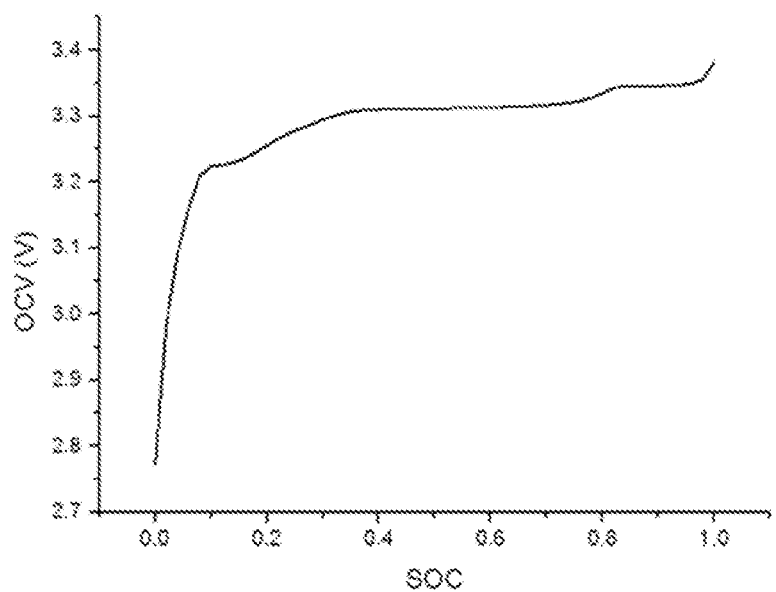
FIG. 7 shows a curve of a state of charge (SOC)-open-circuit voltage (OCV) of a lithium iron phosphate cell in Example 2.
Figure 8:
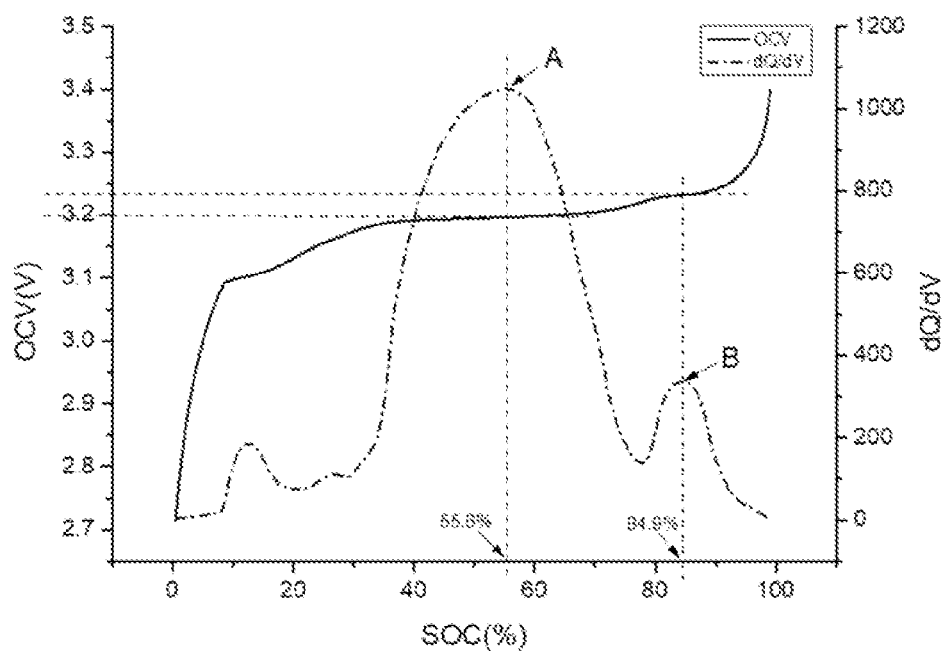
FIG. 8 shows a capacity increment curve of a reference curve of a lithium iron phosphate battery in Example 2.

The EMS transmits a charging/discharging instruction to the PCS to realize a charging or discharging operation. In the charging/discharging process, the BMS master controller acquires the voltage data of each battery cluster of the cell from a BMS middle-level controller of the battery cluster and uploads the current of the cluster to the cloud platform. The cloud platform adopts the five-point cubic smoothing method (two pieces of data before and after the position to be smoothed are selected, that is, five pieces of data in total, and a third-order polynomial is used for fitting to obtain a value after the smoothing) to obtain the capacity increment curve of the SOC-OCV relation data. The SOC-OCV relation diagram is shown in FIG. 7, and the obtained capacity increment curve is shown in a dash-dotted line of dQ/dV (a variation of the SOC relative to the voltage) in FIG. 8. In FIG. 8, the SOC represents the abscissa, the battery OCV represents the left ordinate, and dQ/dV represents the right ordinate. The first characteristic value (the existing accepted method of dQ/dV characteristic value is the maximum value of the variation of the SOC relative to the voltage (dQ/dV)) is located at a point A in FIG. 8, and the corresponding SOC is 55.6%, and the capacity $Q_1=100.08$ Ah. The position of the second characteristic value in the figure is the position of a point B in FIG. 8, the corresponding SOC is 84.9%, and the capacity $Q_2=152.82$ Ah.

A relationship coefficient between a capacity between battery characteristic values and a real battery capacity is calculated.

$$g=\Delta Q/Cap_{initial}=|Q_2-Q_1|/Cap_{initial}=(152.82-100.08)/180=0.293$$

Figure 9:
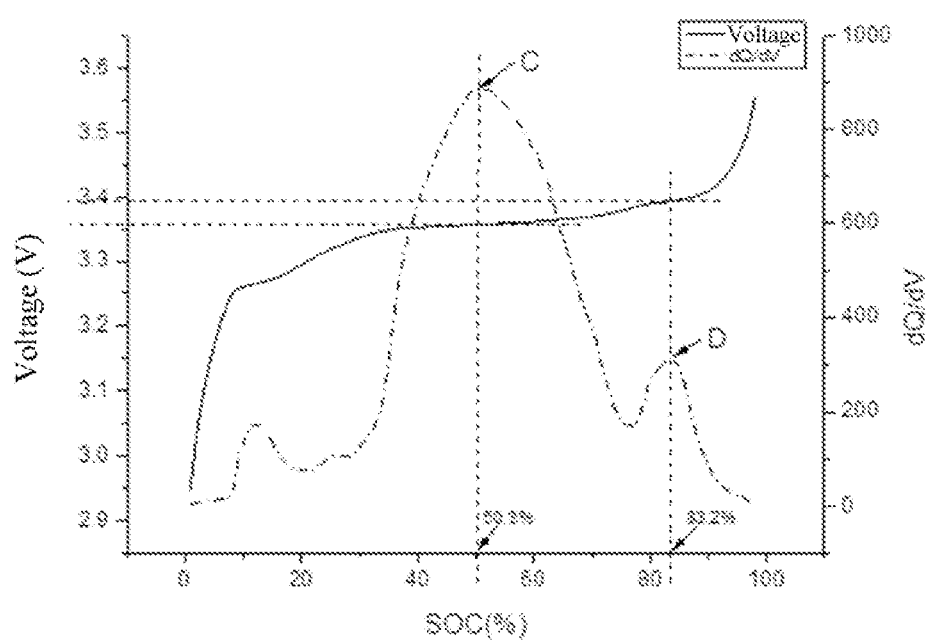
FIG. 9 shows a capacity increment curve of charging data of a lithium iron phosphate battery in Example 2.

The capacity increment curve of the cell 1 in the battery pack is shown in FIG. 9. In FIG. 9, the SOC represents the abscissa, the battery voltage represents the left ordinate, and dQ/dV represents the right ordinate. The position of the first characteristic value in the figure is a point C in FIG. 9, and the corresponding charging capacity value is $Q_{11}'=67.66$ Ah.

The position of the second characteristic value in the figure is the position of a point D in FIG. 9, and the corresponding charging capacity value is $Q_{21}'=119.2$ Ah. The total capacity of the cell 1 in the battery cluster is calculated:

$$Cap_1 = \Delta Q_1/g = |Q_{21}' - Q_{11}'|/g = (119.2 - 67.06)/0.293 = 177.9 \text{ Ah}$$

Figure 10:
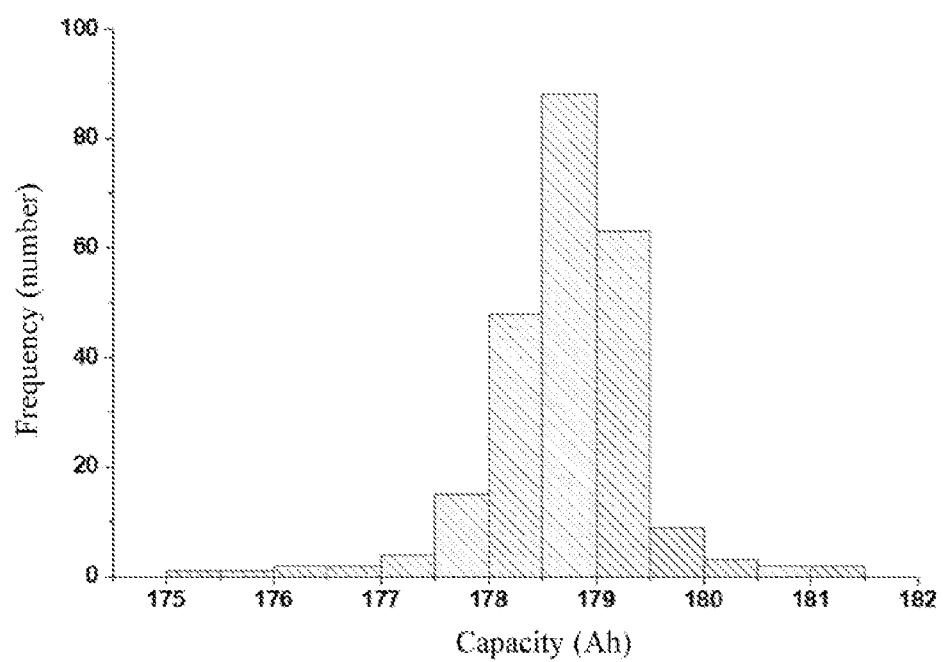
FIG. 10 shows a histogram distribution diagram of capacities of all cells in a battery cluster in Example 2.
Figure 11:
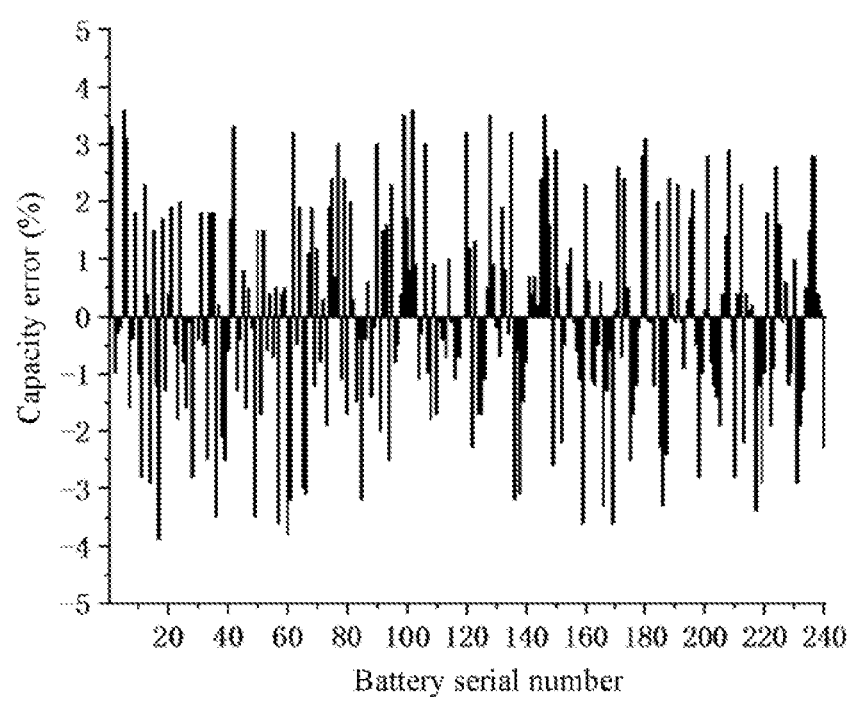
FIG. 11 shows an error graph of a calculated capacity and a real capacity in Example 2.

A total capacity of the cell 2 to a total capacity of the cell 240 in the battery pack are calculated by using the same calculation method, and the total capacities of all of the cells are drawn as a histogram distribution diagram. FIG. 10 is a histogram distribution diagram of capacities of all cells in the battery cluster. By comparing the capacity value calculated by using the method of the invention with a rated capacity value of the battery, a capacity error rate is shown in FIG. 11, and the figure shows that the maximum capacity error is 3.86%. Accordingly, $V_{imax}$ of the capacity increment curve is the position of the point c in FIG. 9, and the corresponding voltage and current are $V_{imax}=3.358$ V and I=63 A. The resistance value of the cell 1 of the battery pack is calculated: (the value of the SOC corresponding to the OCV may be found according to the SOC-OCV relation diagram, that is, $OCV_1$)).

$$R_1 = (V_{1max} - OCV)/I = 2.47 \text{ m}\Omega$$

Figure 12:
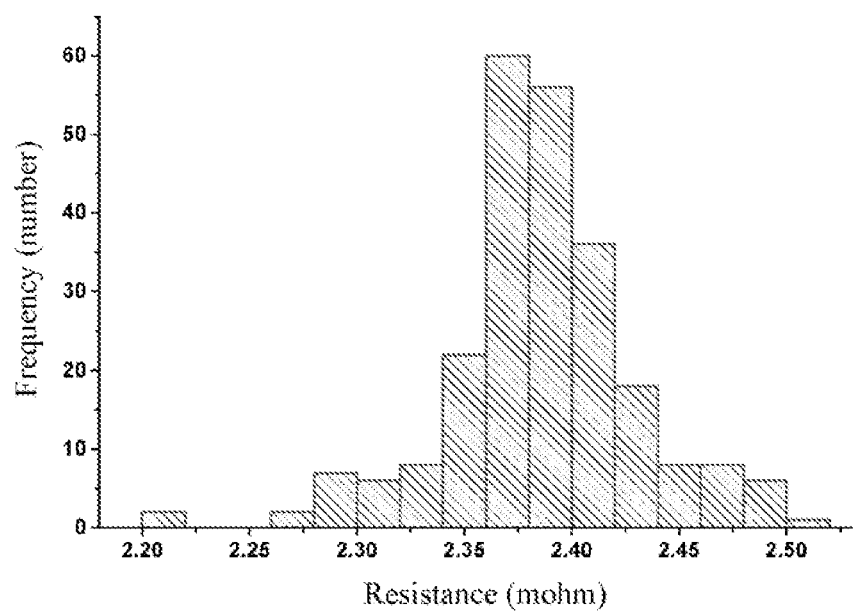
FIG. 12 shows a histogram distribution diagram of DC internal resistance of all cells in a battery cluster in Example 2.

Resistance values of the cell 2 to the cell 240 in the battery pack are calculated by using the same calculation method, and the resistance values of all of the cells are drawn as a histogram distribution diagram. FIG. 12 is a distribution diagram of resistance values of all cells in the battery cluster. Therefore, in the normal charging process of the battery cluster, the resistance value of each cell can be quickly obtained without additional testing of the battery parameter.

Figure 13:
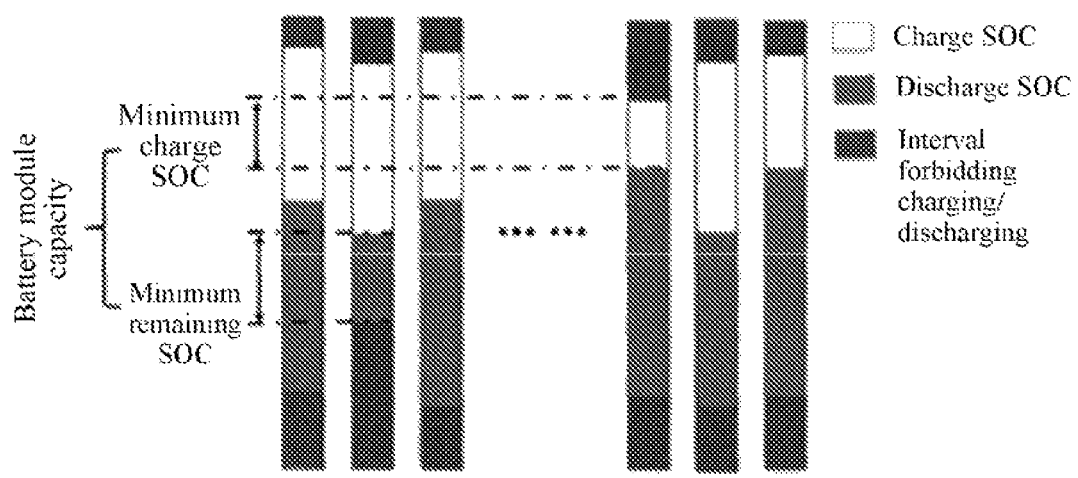
FIG. 13 shows a schematic diagram of a charge electricity quantity, a discharge electricity quantity, and an interval forbidding charging/discharging of each cell in a battery cluster in Example 2.
Figure 14:
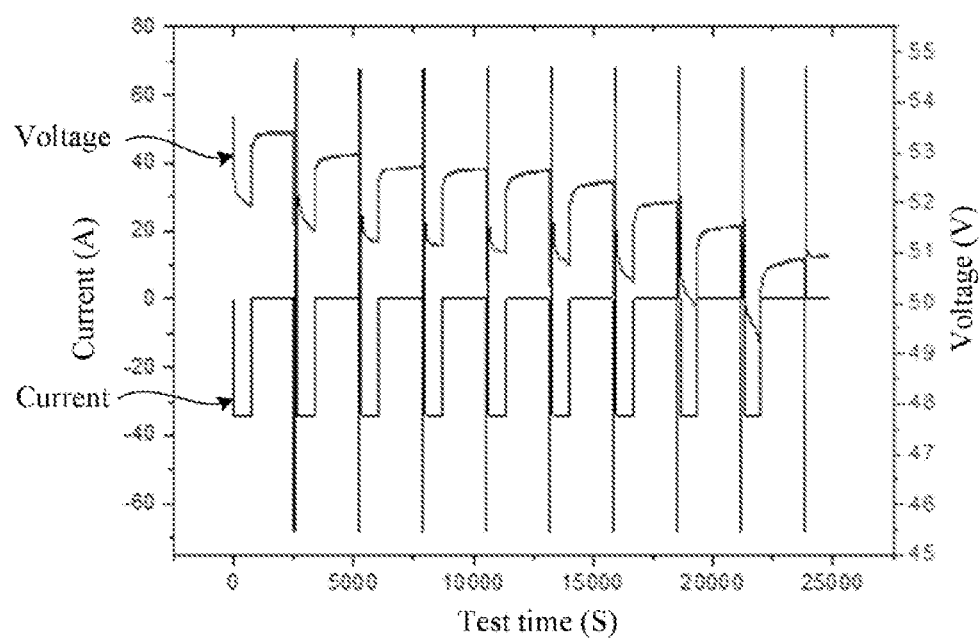
FIG. 14 shows a diagram of an HPPC test working condition in Example 2.

As shown in FIG. 13, the calculation formula of the battery pack capacity is $C_{packnow} = Q_{dis,min} + Q_{cha.min}$, where $Q_{dis,min}$ represents the minimum discharge SOC of the battery pack at this time, and $Q_{cha.min}$ represents the minimum charge SOC of the battery pack at this time. However, $Q_{dis,min}$ and $Q_{cha.min}$ may be obtained by using the following methods: through the pulse experiment described in FIG. 14, corresponding OCV values are obtained by using the formula $$R_{discharge} = \frac{U_1 - U_2}{I},$$

$$R_{charge} = \frac{U_3 - U_4}{I},$$

and U=OCV+RI, the present real SOC value of each cell is obtained by using the SOC-OCV curve relationship, and then $Q_{dis}$ and $Q_{cha}$ of each cell are calculated according to the above calculated capacity of the each cell. Therefore, the present new state-of-health (SOH) value may be corrected to $C_{packnow}/C_{ini}$, where the correction amount $=\Delta C/C_{ini}$, and $\Delta C = C_{packnow} - C_{packbefore}$. Further, the SOC may be corrected, and the ampere-hour integral formula for calculating the SOC is $$SOC = SOC_0 - \frac{1}{C}\int_0^t I dt.$$

Therefore, the present SOC is corrected to $$SOC_0 - \frac{1}{C_{packnow}}\int_0^t I dt,$$

and the correction amount $\Delta SOC = (1/C_{packbefore} - 1/C_{packnow})\int_0^t I dt$.

According to the variation trend of battery characteristic values such as the DC internal resistance, the capacity, and the self-discharge rate and the consistency thereof with time, the reliability threshold and the safety threshold of the battery characteristic values and the consistency thereof are obtained based on the variation law of the same kind and the same batch of lithium batteries in the aging process. A model describing the variation of the characteristic values with time is established to predict the future development trend of the characteristic values, and the dynamic reliability threshold of the abnormal characteristic values is established.

Example 3

Figure 15:
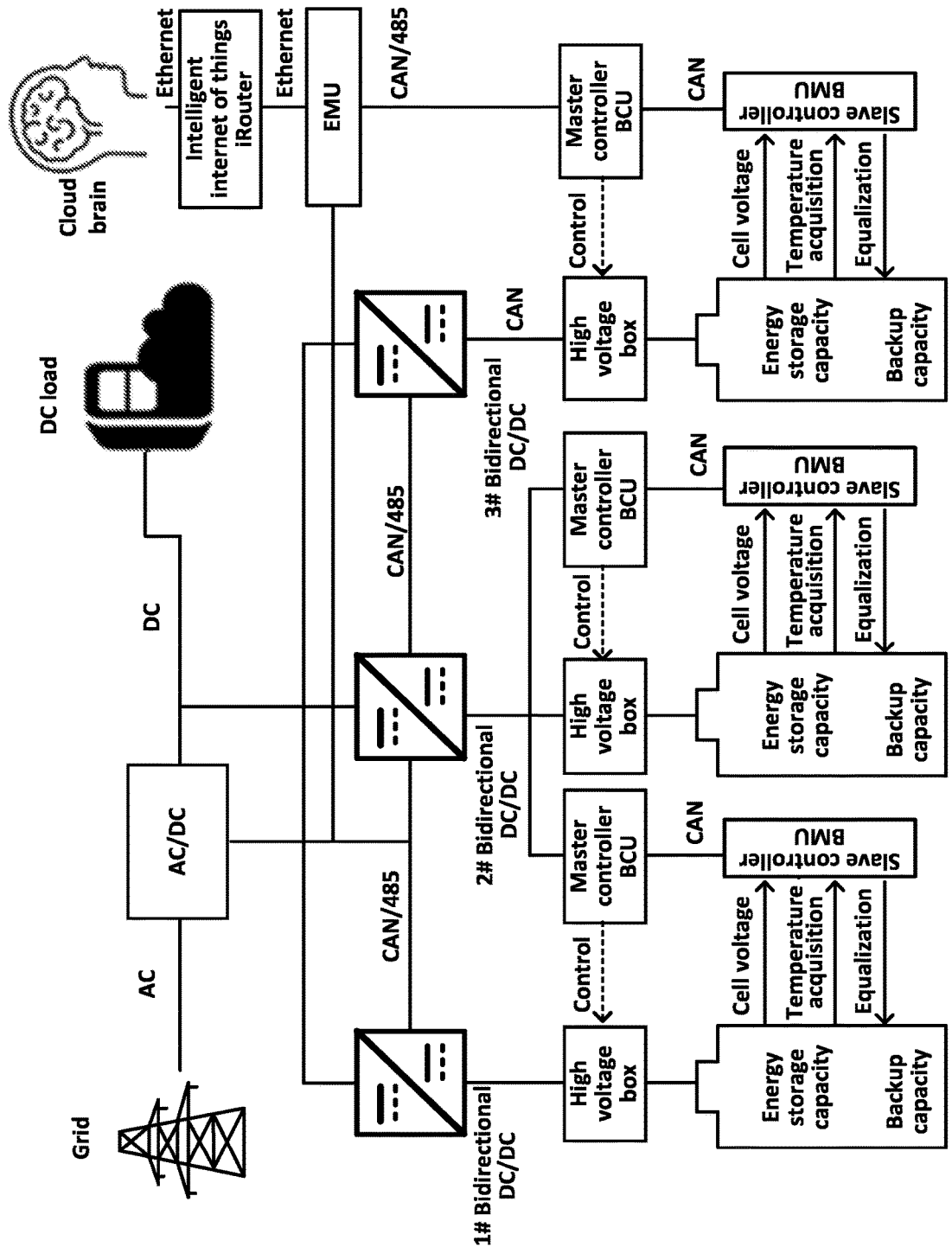
FIG. 15 shows a dynamic management and control system for a backup energy storage power supply design scheme for a DC load in Example 3.

An intelligent backup energy storage power supply system for a DC load is used as an example (in FIG. 15, a DC voltage for a communication base station is −48 V). The dynamic management and control apparatus includes an AC/DC rectifier, a system energy management system (EMS), an intelligent Internet of Things gateway iRouter, analysis by a cloud diagnosis platform, and several backup energy storage power supply systems. Each backup energy storage power supply system includes a bidirectional DC/DC convertor and a battery cluster. For each lithium battery cluster, a BMS master controller battery cluster unit (BCU) is used as a management unit, and a slave controller battery module unit (BMU) having functions such as cell collection is responsible for the management and control of battery modules. The energy management unit is equivalent to integration of the EMS and the battery management master controller. The energy management unit transmits an instruction to control charging/discharging of each battery cluster through the bidirectional DC/DC convertor. It is determined, according to the demand for backup power supply, that a sum of backup power supply capacities reserved for each backup energy storage power supply system can meet the demand of backup power supply, and the rest should be used for "peak shaving and valley filling" to generate economic benefits, and the each backup energy storage power supply system can be regularly allowed to discharge to an ending voltage to verify the capacity of the backup power supply of the backup energy storage power supply system. In the process of charging/discharging each lithium battery cluster, the intelligent Internet of Things gateway iRouter obtains voltage and temperature information of the cell through the master controller BCU, and performs diagnosis at the edge and then uploads the information to the cloud diagnosis platform. As in Example 1 and Example 2, the intelligent Internet of Things gateway iRouter and the diagnostic cloud platform simultaneously perform detection and diagnosis on each lithium battery cluster of the cell according to FIG. 2 without disassembly, and not only can dynamically change the control parameter to improve the safety based on the diagnosis result of each cell, but also can instruct the operation and maintenance person to resume normal operation in time according to preset operation and maintenance rules even if the operation and maintenance is being carried out, so as to achieve the effect of intelligent operation and maintenance.

Example 4

Figure 16:
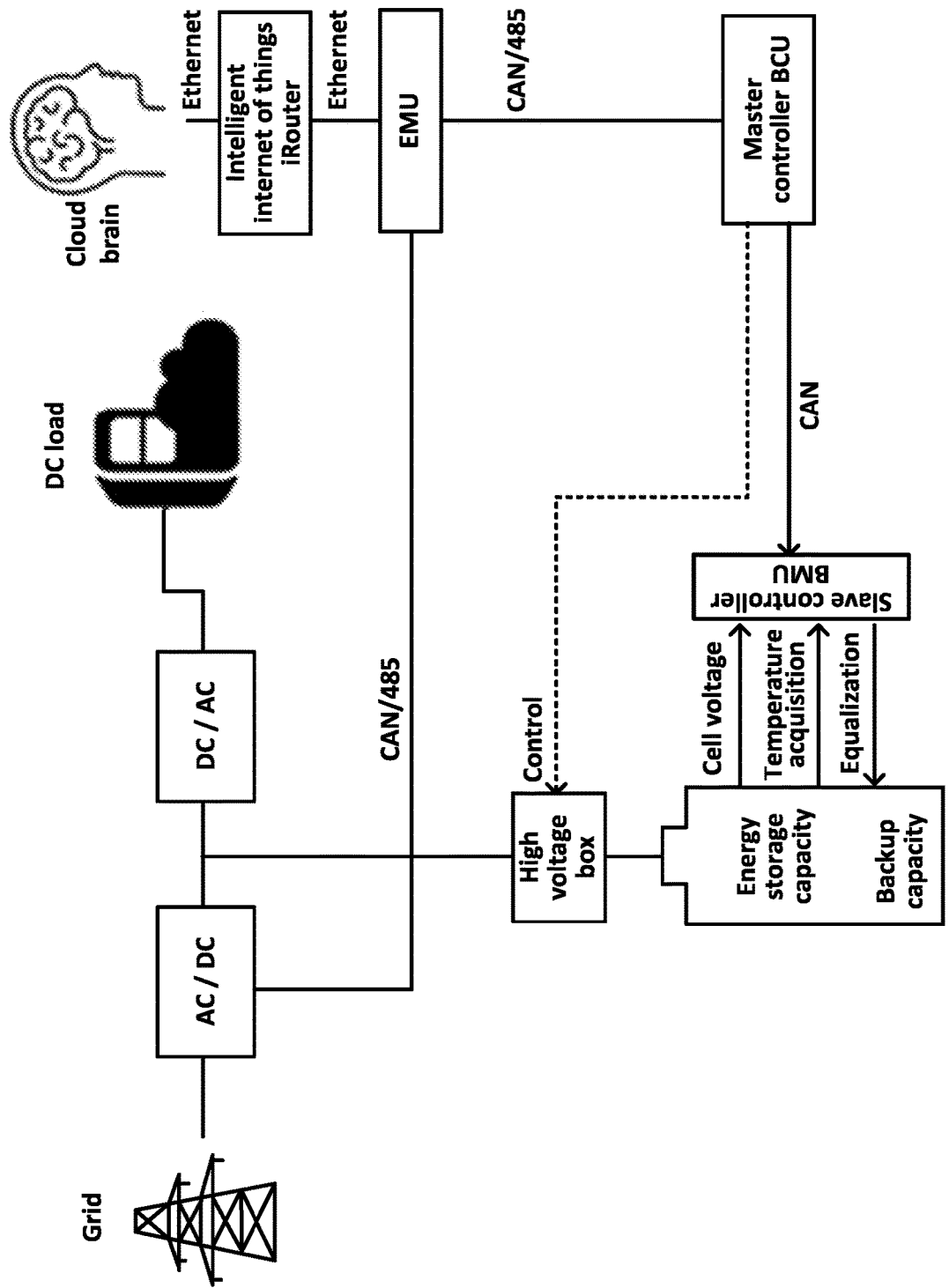
FIG. 16 shows a dynamic management and control system for a backup energy storage power supply design scheme of a DC load in Example 4.

An intelligent backup energy storage power supply system for an AC load is used as an example (FIG. 16). The dynamic management and control apparatus includes an AC/DC rectifier, a backup energy storage power supply system, a DC/AC convertor, an energy management system (EMS), an intelligent Internet of Things gateway iRouter, and analysis by a cloud diagnosis platform of a bypass switch (not shown) for a line from the grid to the AC load. For the backup energy storage power supply system, a BMS master controller BCU is used as a management unit, and a slave controller BMU having functions such as cell collection is responsible for the management and control of battery modules. The energy management unit determines, by transmitting instructions to the bypass switch, the AC/DC, and the DC/AC, whether to bypass, charge, or discharge the lithium battery energy storage system, determines, according to the demand for backup power supply, that the backup power supply capacity reserved by the backup energy storage power supply system can meet the demand of the backup power supply, and the rest can generate economic benefits through peak shaving and valley filling. In addition, the backup energy storage power supply system is regularly allowed to discharge to an ending voltage to verify the capacity of the backup power supply of the backup energy storage power supply system in a case that the commercial power supply is excellent. In the process of charging/discharging of the lithium battery clusters, the intelligent Internet of Things gateway iRouter obtains voltage and temperature information of the cell through the master controller BCU, and the intelligent Internet of Things gateway iRouter performs diagnosis and then uploads the information to the cloud diagnosis platform for analysis. As in Example 1 and Example 2, the intelligent Internet of Things gateway iRouter and the diagnostic cloud platform simultaneously perform detection and diagnosis on each lithium battery cluster of the cell according to FIG. 2 without disassembly, and not only can dynamically change the control parameter to improve the safety based on the diagnosis result of each cell, but also can instruct the operation and maintenance person to resume normal operation in time according to preset operation and maintenance rules even if the operation and maintenance is being carried out, so as to achieve the effect of intelligent operation and maintenance.

Example 5

It can be seen from the above examples and embodiments that the cells in the lithium battery are connected in series, and then a charging current/discharging current of each of the cells, a charging current/discharging current of each battery cluster of the lithium battery, and a charging current/discharging current of the battery pack of the lithium battery are all the same.

This embodiment provides a system for dynamic management and control of a lithium battery energy storage system, including:

an EMS, a BMS, and a lithium battery.

The EMS is configured to: control a lithium battery to charge/discharge when a charging instruction/discharging instruction is acquired; acquire battery data of the lithium battery in the charging/discharging process from the BMS; and detect and analyze the lithium battery based on the acquired battery data.

The BMS is configured to acquire the battery data of the lithium battery in the charging/discharging process of the lithium battery.

The lithium battery is configured to charge/discharge under the control of the charging instruction/discharging instruction transmitted by the EMS.

The system for dynamic management and control of a lithium battery energy storage system further includes a diagnosis apparatus.

The diagnosis apparatus is configured to transmit the charging instruction/discharging instruction to the EMS.

The diagnosis apparatus may be a diagnostic cloud platform, an intelligent edge device with edge computing, or a microcontroller unit (MCU) directly in the BMS master controller. Alternatively, a diagnosis algorithm may be arranged on three different computing units such as the cloud, an edge, or a terminal. In an actual situation, determinations as to whether real-time data transmission is needed to avoid a delay of data transmission (at this time, the diagnosis algorithm tends to be close to the end) and whether it is necessary to balance the arrangement of different algorithms according to historical data (at this time, the diagnosis algorithm should be arranged on the cloud platform) are made according to a data transmission bandwidth and computing ability costs.

The functions realized by the EMS are described in detail through the following content.

As shown in FIG. 3, the charging instruction/discharging instruction received by the EMS that is transmitted by the diagnosis apparatus is transmitted to the EMS by the diagnosis apparatus through an intelligent gateway.

In addition to the acquired charging instruction/discharging instruction in the above manner, the charging instruction/discharging instruction acquired by the EMS may further be transmitted by the power grid or the EMS at the upper level of the EMS. Details are not described herein again.

The EMS transmits the obtained charging instruction/discharging instruction to the BMS master controller of the battery pack of the lithium battery after obtaining the charging instruction/discharging instruction. Then the BMS master controller transmits the charging instruction/discharging instruction to battery cluster management units arranged in different battery clusters in the battery pack of the lithium battery. Finally, the battery cluster management unit transmits the charging instruction/discharging instruction to the BMS slave controller of each cell in different battery clusters, so as to control said each cell in the battery pack to be charged/discharged.

The charging current/discharging current of the lithium battery during charging/discharging, the charging current/discharging current of each of the battery clusters, and the charging current/discharging current of the lithium battery are all the same.

It may be determined from FIG. 3 that the BMS master controller, the battery cluster management unit, and the BMS slave controller constitute the BMS in the lithium battery energy storage system of this embodiment.

The specific process in which the EMS is configured to acquire the battery data of the lithium battery in the charging/discharging process is as follows. In the process of charging/discharging each cell, the BMS slave controller of said each cell transmits the battery data of said each cell to the BMS master controller through the battery cluster management unit of the battery cluster where the cell is located. The battery cluster management unit of the battery cluster transmits the battery data of the battery cluster to the BMS master controller, The BMS master controller transmits the acquired battery data of each cell, the battery data of each battery cluster uploaded by the each battery cluster, and the battery data of the battery pack of the lithium battery detected by the BMS master controller to the EMS together as the battery data of the lithium battery in the charging/discharging process, so that the EMS can acquire the battery data of the lithium battery in the charging/discharging process.

The battery data of said each cell includes but is not limited to the charging current/discharging current and the charging voltage/discharging voltage of said each cell, a charging beginning moment, a charging ending moment, a discharging beginning moment, and a discharging ending moment of said each cell.

The charging beginning moment, the charging ending moment, the discharging beginning moment, and the discharging ending moment of said each cell are recorded and transmitted to the BMS master controller by the BMS slave controller of said each cell.

The charging current/discharging current of said each cell and the charging voltage/discharging voltage of said each cell are measured by the BMS of said each cell in the process of charging/discharging said each cell.

The battery data of the battery cluster includes but is not limited to a current of the each battery cluster in the lithium battery and a voltage of the each battery cluster in the lithium battery.

The battery data of the battery cluster of the lithium battery includes but is not limited to a current of the lithium battery and a voltage of the lithium battery.

The BMS master controller further stores historical battery data of said each cell.

The historical battery data of said each cell includes a historical current of said each cell and a historical voltage of said each cell.

The battery data further stored in the BMS master controller further includes a cell identifier of said each cell, a voltage value of said each cell at the beginning of charging, and a voltage value of said each cell during idling before charging. Therefore, a correspondence between the cell identifier of said each cell and the battery data is formed and stored in the BMS master controller, In an implementation, for any cell, the correspondence between the cell identifier of the cell and the battery data may include a correspondence among the cell identifier of the cell, an initial capacity of the cell, the voltage value of the cell at the beginning of charging, the voltage value of the cell during idling before charging, the historical current of the cell, the historical voltage of said each cell, the maximum current of the cell, the SOC value of the cell at the beginning of charging, and the battery capacity of the cell before SOC correction.

The SOC value of the cell at the beginning of charging is read from said each cell by the BMS master controller at the beginning of charging of said each cell, the read SOC value of said each cell at the beginning of charging is stored in the correspondence between the cell identifier and the battery data of said each cell, and the correspondence between the cell identifier and the battery data of said each cell is updated.

The EMS is configured to detect and analyze the lithium battery based on the acquired battery data, and the following step (1) to step (2) may be performed:
(1) Calculate a resistance, a present capacity, and a self-discharge parameter of each cell by using the battery data; and (2) Transmit a charge/discharge stop instruction to the lithium battery when the resistance is greater than an internal resistance threshold, the capacity is greater than a capacity threshold, or the self-discharge parameter is greater than a self-discharge parameter threshold, to stop the present charging/discharging process of the lithium battery.

The internal resistance threshold, the capacity threshold, and the self-discharge parameter threshold are all cached in the EMS in advance.

The battery data further includes the voltage value of said each cell at the beginning of charging and the voltage value of said each cell during idling before charging.

When the diagnosis apparatus acquires the historical battery data of said each cell from the BMS master controller, analyzes the historical battery data of said each cell to obtain an internal resistance reliability threshold and an internal resistance safety threshold of the lithium battery, and transmits the internal resistance reliability threshold and the internal resistance safety threshold to the EMS, the EMS being configured to detect and analyze the lithium battery based on the acquired battery data includes step (1) to step (5) below.

(1) Acquire the voltage value of said each cell at the beginning of charging and the voltage value of said each cell during idling before charging.

(2) Calculate an internal resistance of said each cell by using the current of said each cell, the voltage value of said each cell at the beginning of charging, and the voltage value of said each cell during idling before charging.

(3) Determine one of the cells having the internal resistance greater than the internal resistance safety threshold as a to-be-retired cell.

(4) Determine one of the cells having the internal resistance of the cell between the internal resistance reliability threshold and the internal resistance safety threshold as a sub-healthy cell.

(5) Acquire a current correction parameter of the sub-healthy cell, and correct a maximum current of the sub-healthy cell.

The specific process in which the diagnosis apparatus acquires the historical battery data of said each cell from the BMS master controller, and analyzes the historical battery data of said each cell to obtain the internal resistance reliability threshold and the internal resistance safety threshold of the lithium battery is the prior art, and the details are not described herein again.

In an implementation, the internal resistance reliability threshold is 6 mΩ, and the internal resistance safety threshold is 13 mΩ.

In the above step (1), the voltage value of said each cell at the beginning of charging and the voltage value of said each cell during idling before charging are acquired from the BMS master controller by the EMS.

In the above step (2), the internal resistance of said each cell is calculated by using the following formula:

$$R = \frac{U_1 - U_2}{I}$$

where R represents the internal resistance of said each cell, $U_1$ represents the voltage value of said each cell at the beginning of charging, $U_2$ represents the voltage value of said each cell during idling before charging, and I represents the current generated in the charging/discharging process of said each cell.

In the above step (3), the internal resistance safety threshold is cached in the EMS.

The to-be-retired cell is used for representing a cell with a serious fault and "potential safety hazards".

In the above step (4), the sub-healthy cell is used for representing a cell with potential reliability hazards.

In the above step (5), a maximum current of the sub-healthy cell is corrected by using the following formula:

$$I_{sub\text{-}healthy} = \alpha * I_{normal},$$

$I_{sub\text{-}healthy}$ represents the maximum current of the sub-healthy cell, $I_{normal}$ represents the maximum current of a normal cell before correction, and a value of a is a constant between 0.5 and 0.9.

When the maximum current of the cell needs to be corrected, the EMS may query the maximum current of the cell from the correspondence between the cell identifier of the cell and the battery data according to the cell identifier of the cell that is determined as the sub-healthy cell.

Optionally, when the lithium battery is in the charging process, the EMS is configured to detect and analyze the lithium battery based on the acquired battery data, and the following step (10) to step (11) may be performed.

(10) Acquire, when a voltage of the cell determined as the to-be-retired cell continuously drops in the charging process and an accumulated voltage drop value exceeds an accumulated voltage drop threshold, a cell identifier of one of the cells determined as the to-be-retired cell having the voltage continuously dropping and the accumulated voltage drop value exceeding the accumulated voltage drop threshold.

(11) Generate battery enabling/disabling information based on the acquired cell identifier, and transmit the generated battery enabling/disabling information to the diagnosis apparatus.

In the above step (10), after the EMS acquires the voltage of the cell determined as the to-be-retired cell from the BMS master controller and performs analysis, in a case that it is determined that the accumulated voltage drop value of the cell determined as the to-be-retired cell exceeds the accumulated voltage drop threshold, the above step (10) to step (11) are performed.

The accumulated voltage drop threshold may be set to any voltage value in a range of 20 mV to 50 mV. In an implementation, the accumulated voltage drop threshold may be set to 30 mV.

The EMS acquires the correspondence between the cell identifier of the cell and the battery data from the BMS master controller, so as to acquire the cell identifier of one of the cells determined as the to-be-retired cell having the voltage continuously dropping and the accumulated voltage drop value exceeding the accumulated voltage drop threshold.

Optionally, the EMS being configured to calculate a present capacity of each cell by using the battery data includes step (21) to step (26) below.

(21) Process the current of said each cell and the voltage of said each cell in each battery cluster by using a five-point cubic smoothing method, to obtain a correspondence between an SOC and an OCV of said each cell, a capacity increment curve of the lithium battery, and a capacity increment curve of the cell, where the capacity increment curve includes a curve of a relationship among a variation of the SOC relative to a voltage, the SOC, and the OCV.

(22) Determine a first maximum point and a second maximum point of the variation of the SOC relative to the voltage from the capacity increment curve of the lithium battery.

(23) Determine a first SOC corresponding to the first maximum point and a second SOC corresponding to the second maximum point from the capacity increment curve of the lithium battery.

(24) Calculate a first battery capacity based on the first SOC, and calculate a second battery capacity based on the second SOC.

(25) Calculate a relationship coefficient between a capacity between battery characteristic values and a real battery capacity by using the following formula, $$g = |Q_2 - Q_1| / \text{Cap}_{initial}$$

where g represents the relationship coefficient between the capacity between the battery characteristic values and the real battery capacity; $Q_1$ represents the first battery capacity; $Q_2$ represents the second battery capacity; and Cap initial represents a rated battery capacity.

(26) Calculate the present capacity of said each cell by using the calculated relationship coefficient between the capacity between the battery characteristic values and the real battery capacity, and detect capacity consistency of said each cell by using the calculated present capacity of the cell.

In the above step (21), the correspondence between the SOC and the OCV of the battery is the SOC-OCV relation curve shown in FIG. 7.

The capacity increment curve of the lithium battery is the dQ/dV curve shown in FIG. 8 and FIG. 9.

The specific process in which the current of said each cell and the voltage of said each cell in each battery cluster are processed by using a five-point cubic smoothing method, to obtain a correspondence between a battery SOC and an OCV of said each cell, a capacity increment curve of the lithium battery, and a capacity increment curve of the cell is the prior art, and the details are not described herein again.

In the above step (22), the variation of the SOC relative to the voltage is dQ/dV. As shown in FIG. 8, a first maximum point of the variation of the SOC relative to the voltage is a point A, and a second maximum point is a point B.

In the above step (23), in the capacity increment curve of the lithium battery, the first SOC corresponding to the first maximum point is 55.6%, and the second SOC corresponding to the second maximum point is 84.9%.

In the above step (24), the first battery capacity and the second battery capacity are respectively calculated by using the following battery capacity calculation formula:

$$Q = SOC * 180 \text{ Ah}.$$

Through the calculation by using the above formula, the first battery capacity of 100.08 Ah and the second battery capacity of 152.82 Ah may be obtained.

In the above step (25), the rated capacity of the battery is obtained by the EMS from the BMS central control. The rated capacity of the battery is cached in the BMS master controller, The relationship coefficient of 0.293 between the capacity between the battery characteristic values and the real battery capacity may be calculated according to the first battery capacity of 100.08 Ah and the second battery capacity of 152.82 Ah.

In the above step (26), in order to calculate the present capacity of each cell by using the calculated relationship coefficient between the capacity between the battery characteristic values and the real battery capacity, reference is made to the schematic diagram of the capacity increment curve of the cell with the cell identifier of 1 shown in FIG. 9. The EMS may determine a third maximum point (a point C) and a fourth maximum point (a point D) of the variation of the SOC of the cell 1 relative to the voltage. It is determined from the capacity increment curve of the cell 1 that the third SOC corresponding to the third maximum point is 50.3% and the fourth SOC corresponding to the fourth maximum point is 83.2%. Herein, as shown in FIG. 9, the third maximum point is a first extreme point of the variation of the SOC of the cell 1 relative to the voltage, and the fourth maximum point is a second extreme point of the variation of the SOC of the cell 1 relative to the voltage.

The charging capacity value of $Q_{11}'=67.06$ Ah of the third maximum point (the point C) may be calculated through the above battery capacity calculation formula. The charging capacity value of the fourth maximum point (the point D) is $Q_{22}'=119.2$ Ah. The present capacity of the cell with the cell identifier of 1 may be calculated by using the following formula.

$$Cap_1 = \Delta Q_1/g = |Q_{21}' - Q_{11}''|/g = (119.2-67.06)/0.293 = 177.9 \text{ Ah}$$

$Cap_1$ represents the present capacity of the cell with the cell identifier of 1.

In the above manner, the present capacity of each cell may be calculated. After the present capacity of said each cell is calculated, the EMS transmits the calculated present capacity of said each cell to the BMS master controller for storage.

In order to detect the capacity consistency of the cells by using the calculated present capacity of the cell, the EMS may perform the following step (1) to step (2).

(1) Acquire an initial capacity of the cell from a BMS.

(2) Calculate an SOH of the cell by using the present capacity and the initial capacity of the cell, and determine the cell as a to-be-maintained cell when the SOH is less than an SOH threshold.

In the above step (1), the EMS may acquire the initial capacity of the cell from the correspondence between the cell identifier of said each cell stored in the BMS and the battery data.

In the above step (2), the battery SOH of the cell is calculated by using the following formula:

Battery SOH of the cell=present capacity of the cell/initial capacity of the cell.

After the battery SOH of said each cell is obtained, in order to calculate the resistance of said each cell by using the battery data, the EMS may perform the following step (21) to step (23).

(21) Acquire a maximum point of the variation of the SOC relative to the voltage in the capacity increment curve of the cell, and determine the SOC corresponding to the maximum point from the capacity increment curve of the cell.

(22) Acquire a current and a voltage of the cell at the maximum point of the variation of the SOC relative to the voltage from the BMS, and determine the OCV of the cell from the correspondence between the SOC and the OCV of the cell.

(23) Calculate a resistance of the cell by using the following formula:

$$R' = (V - OCV)/I'$$

where R' represents the resistance of the cell; V represents the voltage of the cell at the maximum point of the variation of the SOC relative to the voltage; I' represents the current of the cell at the maximum point of the variation of the SOC relative to the voltage; and OCV represents the OCV of the cell.

In the above step (21), reference is made to the schematic diagram of the capacity increment curve of the cell with the cell identifier of 1 shown in FIG. 9. The EMS may determine that the maximum point of the variation of the SOC of the cell 1 relative to the voltage is the point C.

In the above step (22), the BMS master controller may record currents and voltages corresponding to specific values of the variation of the SOC relative to the voltages in the capacity increment curve of the cell in the charging or discharging process.

The specific values of the variations of the SOCs relative to the voltage form the dQ/dV curve in the capacity increment curve of the cell.

The EMS may acquire the current and the voltage of the cell at the maximum point of the variation of the SOC relative to the voltages from the BMS master controller, The EMS may further determine the OCV of the cell from the correspondence between the SOC and the OCV of the cell by using the determined SOC corresponding to the maximum point.

Further, the EMS may further correct the SOC of the cell in the following manners. The EMS being configured to detect and analyze the lithium battery based on the acquired battery data includes step (1) to step (2) below.

(1) Obtain a battery capacity and a charging/discharging time of the cell before SOC correction from the BMS.

(2) Calculate an SOC correction value of the cell by using the following formula:

$$\Delta SOC = (1/C_{packbefore} - 1/C_{packnow}) \int_0^t I dt$$

where $\Delta SOC$ represents the SOC correction value of the cell; $C_{packbefore}$ represents the battery capacity of the cell before the SOC correction; $C_{packnow}$ represents the present capacity of the cell; t represents the charging/discharging time of the cell; and I represents a current generated by the cell during charging/discharging.

In the above step (1), the battery capacity of the cell before the SOC correction is stored in the correspondence between the cell identifier of the cell and the battery data in BMS master controller, Then the EMS may query the battery capacity of the cell before SOC correction from the BMS master controller through the cell identifier of the cell.

The current generated by the cell in the charging/discharging process is the above charging/discharging current of the cell.

That is, I represents the charging current or discharging current of the cell.

The BMS master controller records the charging/discharging time of the cell during the charging/discharging of the cell. The EMS may query the charging/discharging time of the cell from the BMS master controller, In addition to the above manners of detecting the consistency of the battery, the EMS may be further configured to measure a difference $\Delta t$ (that is, the self-discharge coefficient of the cell) between the charging times and the minimum charging time of the cells i in the lithium battery, to ensure the consistency of the charging times of the cells i during charging of the lithium battery. Ensuring the consistency of the charging times of the cells i during charging of the lithium battery means ensuring that the charging times of the cells i approximate each other.

In the charging process, when one cell of the lithium battery is fully charged, all of other cells stop being charged, and other cells need more time to be fully charged than the cell. $\Delta t$ is defined to represent the difference between the charging times and the minimum charging time of the cells i in the lithium battery, so as to ensure that the charging times of the cells i approximate each other during charging of the lithium battery.

Assuming that the shortest charging time for fully charging all of the cells is $t_{min}$, a difference $\Delta t_i$ between the charging time for fully charging an $i^{th}$ cell and the shortest charging time is $\Delta t_i$. $\Delta t_i$ is the self-discharge parameter of the $i^{th}$ cell.

The process of calculating a self-discharge parameter of each cell by using the battery data is as follows:

$$\Delta t_i = t_{i,full} - t_{min}.$$

The charging time for fully charging the $i^{th}$ cell is t $t_{i,full}$, and the calculation formula is $t_{i,full} = C_{i,charge}/I$. $C_{i,charge}$ represents a charge capacity of the $i^{th}$ cell.

A specific calculation process of $C_{i,charge}$ is as follows:
The charge capacity of the $i^{th}$ cell:

$$C_{i,charge} = \int_{t_{i,begin}}^{t_{i,end}} Idt + (1 - SOC_{i,now}) * Q_{imax},$$

where $t_{i,begin}$ represents a charging beginning moment of the $i^{th}$ cell, $t_{i,end}$ represents a charging ending moment of the $i^{th}$ cell, and $SOC_{i,now} = SOC_{i,initial} + \int_{t_{i,begin}}^{t_{i,end}} Idt/Q_{imax}$; $SOC_{i,now}$ represents the SOC value of the $i^{th}$ cell at the charging ending moment, $Q_{imax}$ represents the present capacity of the $i^{th}$ cell, and $SOC_{i,initial}$ represents the SOC value of the $i^{th}$ cell at the beginning of charging.

$SOC_{i,initial}$ is obtained by the EMS from the correspondence between the cell identifier of the $i^{th}$ cell stored in the BMS master controller and the battery data.

$$Q_{imax} = \Delta Q_i/g$$

The manner of acquiring $\Delta Q_i$ is similar to the calculation process of the present capacity of the above cell 1, and the details are not described herein again.

Figure 17:
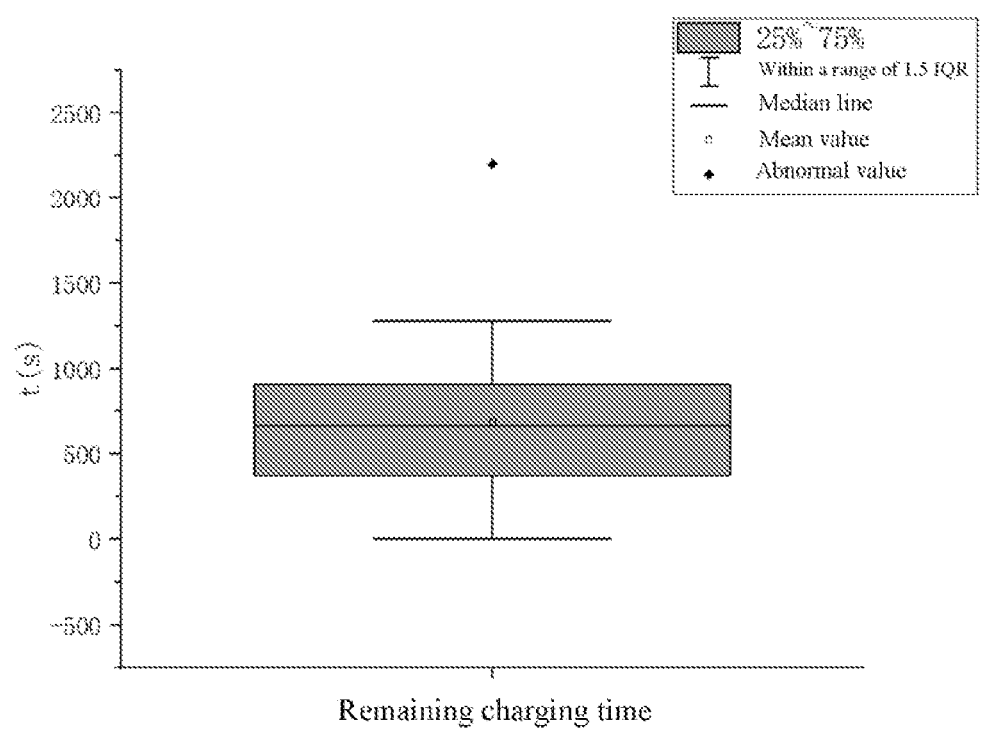
FIG. 17 is a graph showing a relationship between a difference between a charging time and a minimum charging time of each cell i in the lithium battery and the remaining charging time in the lithium battery energy storage system provided in Example 5.

FIG. 17 is a diagram of a relationship between a difference between a charging time and a minimum charging time of each cell i and the remaining charging time in a lithium battery. The ordinate tin FIG. 17 is $\Delta t$. The $\Delta t$ distribution is analyzed by a box plot. If the maximum value of $\Delta t$ exceeds a box plot threshold of the whole $\Delta t$ array (equivalent to 2.37σ), it means that the cell needs an unusually long time to charge due to self-discharging to a greater extent. For example, if the maximum value is within 2.37σ, it is determined that general self-discharge warning is "abnormal". If the maximum value exceeds 2.37σ, it is determined that a self-discharge fault occurs, and the operation and maintenance module is maintained by replacing the cell.

The EMS being configured to calculate a self-discharge parameter of each cell by using the battery data includes step (1) to step (5) below.

(1) Acquire a charging beginning moment, a charging ending moment, the present capacity of said each cell, and an SOC value at the beginning of charging.

(2) Calculate the SOC value of said each cell at the charging ending moment by using the following formula:

$$SOC_{i,now} = SOC_{i,initial} + \int_{t_{i,begin}}^{t_{i,end}} Idt/Q_{imax}$$

where $SOC_{i,now}$ represents the SOC value of an $i^{th}$ cell at the charging ending moment; $Q_{imax}$ represents the present capacity of the $i^{th}$ cell; $SOC_{i,initial}$ represents the SOC value of the $i^{th}$ cell at the beginning of the charging; $t_{i,begin}$ represents the charging beginning moment of the $i^{th}$ cell; and $t_{i,end}$ represents the charging ending moment of the $i^{th}$ cell.

(3) Calculate a charge capacity of said each cell by using the following formula:

$$C_{i,charge} = \int_{t_{i,begin}}^{t_{i,end}} Idt + (1 - SOC_{i,now}) * Q_{imax}, \text{ where}$$

$C_{i,charge}$ represents the charge capacity of the $i^{th}$ cell;

(4) Determine a shortest charging time for fully charging the cell according to the charging beginning moment and the charging ending moment of said each cell.

(5) Calculate the self-discharge parameter of said each cell by using the following formula:

$$t_{i,full} = C_{i,charge}/I$$

$$\Delta t_i = t_{i,full} - t_{min}, \text{ where}$$

$t_{i,full}$ represents the charging time for fully charging the $i^{th}$ cell; $t_{min}$ represents a smallest one of times for fully charging all of the cells; and $\Delta t_i$ represents the self-discharge parameter of the $i^{th}$ cell.

In the above step (4), the charging calculation time of each cell may be calculated according to the charging ending moment of said each cell minus the charging beginning moment. The charging times of the cells are compared with each other, and the smallest one of the charging times of the cells is determined as the shortest charging time for fully charging the cells.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A system for dynamic management and control of a lithium battery energy storage system, the system comprising:
   an energy management system (EMS), a battery management system (BMS), and a lithium battery,
   wherein the EMS is configured to: control a lithium battery to charge/discharge when a charging instruction/discharging instruction is acquired; acquire battery data of each cell in the lithium battery in the charging/discharging process from the BMS; and detect and analyze the lithium battery based on the acquired battery data;
   wherein the BMS is configured to acquire the battery data of the lithium battery in the charging/discharging process of the lithium battery;
   wherein the lithium battery is configured to charge/discharge under the control of the charging instruction/discharging instruction transmitted by the EMS;
   wherein the EMS is configured to detect and analyze the lithium battery based on the acquired battery data comprises:
   calculating a resistance, a present capacity, and a self-discharge parameter of each cell by using the battery data; and
   transmitting a charge/discharge stop instruction to the lithium battery when the resistance is greater than an internal resistance threshold, the present capacity is greater than a capacity threshold, or the self-discharge parameter is greater than a self-discharge parameter threshold, to stop the present charging/discharging process of the lithium battery; and wherein the battery data comprises a current of said each cell, a voltage value of said each cell at the beginning of charging, and a voltage value of said each cell during idling before charging; the BMS comprises a BMS master controller; the dynamic management and the control of the lithium energy storage system further comprises a diagnosis apparatus;

when the diagnosis apparatus acquires historical battery data of said each cell from the BMS master controller, analyzes the historical battery data of said each cell to obtain an internal resistance reliability threshold and an internal resistance safety threshold of the lithium battery, and transmits the internal resistance reliability threshold and the internal resistance safety threshold to the EMS, the EMS being configured to detect and analyze the lithium battery based on the acquired battery data further comprises:

acquiring the voltage value of said each cell at the beginning of charging and the voltage value of said each cell during idling before charging;

calculating an internal resistance of said each cell by using the current of said each cell, the voltage value of said each cell at the beginning of charging, and the voltage value of said each cell during idling before charging;

determining one of the cells having the internal resistance greater than the internal resistance safety threshold as a to-be-retired cell;

determining one of the cells having the internal resistance between the internal resistance reliability threshold and the internal resistance safety threshold as a sub-healthy cell; and acquiring a current correction parameter of the sub-healthy cell, and correcting a maximum current of the sub-healthy cell.

2. The system according to claim 1, wherein when the lithium battery is in the charging process, the EMS being configured to detect and analyze the lithium battery based on the acquired battery data comprises:

acquiring, when a voltage of the cell determined as the to-be-retired cell continuously drops in the charging process and an accumulated voltage drop value exceeds an accumulated voltage drop threshold, a cell identifier of one of the cells determined as the to-be-retired cell having a voltage continuously dropping and the accumulated voltage drop value exceeding the accumulated voltage drop threshold; and generating battery enabling/disabling information based on the acquired cell identifier, and transmitting the generated battery enabling/disabling information to the diagnosis apparatus.

3. The system according to claim 1, wherein the EMS being configured to calculate a present capacity of each cell by using the battery data comprises:

processing a current and a voltage of said each cell in each battery cluster by using a five-point cubic smoothing method, to obtain a correspondence between a battery state of charge (SOC) and an open-circuit voltage (OCV) of the cell, a capacity increment curve of the lithium battery, and a capacity increment curve of the cell, wherein the capacity increment curve comprises a curve of a relationship among a variation of the SOC relative to the voltage, the SOC, and the OCV;

determining a first maximum point and a second maximum point of the SOC relative to the voltage variation from the capacity increment curve of the lithium battery;

determining a first SOC corresponding to the first maximum point and a second SOC corresponding to the second maximum point from the capacity increment curve of the lithium battery;

calculating a first battery capacity based on the first SOC, and calculating a second battery capacity based on the second SOC;

calculating a relationship coefficient between a capacity between battery characteristic values and a real battery capacity by using the following formula, wherein $$g=|Q_2-Q_1|/Cap_{initial}$$

wherein g represents the relationship coefficient between the capacity between the battery characteristic values and the real battery capacity; $Q_1$ represents the first battery capacity; $Q_2$ represents the second battery capacity; and Cap initial represents a rated battery capacity; and calculating the present capacity of said each cell by using the calculated relationship coefficient between the capacity between the battery characteristic values and the real battery capacity, and detecting capacity consistency of said each cell by using the calculated present capacity of the cell.

4. The system according to claim 3, EMS, wherein the EMS being configured to detect capacity consistency of said each cell by using the calculated present capacity of the cell comprises:

acquiring an initial capacity of the cell from the BMS; and calculating a battery state-of-health (SOH) of the cell by using the present capacity and the initial capacity of the cell, and determining the cell as a to-be-maintained cell when the SOH is less than an SOH threshold.

5. The system according to claim 4, EMS, wherein the EMS being configured to calculate a resistance of each cell by using the battery data comprises:

acquiring a maximum point of the variation of the SOC relative to the voltage in the capacity increment curve of the cell, and determining the SOC corresponding to the maximum point from the capacity increment curve of the cell;

acquiring a current and a voltage of the cell at the maximum point of the variation of the SOC relative to the voltage from the BMS, and determining the OCV of the cell from the correspondence between the SOC and the OCV of the cell; and calculating the resistance of the cell by using the following formula:

$$R'=(V-OCV)/I'$$

wherein R' represents the resistance of the cell; V represents the voltage of the cell at the maximum point of the variation of the SOC relative to the voltage; I' represents the current of the cell at the maximum point of the variation of the SOC relative to the voltage; and OCV represents the OCV of the cell.

6. The system according to claim 3, wherein the EMS being configured to detect and analyze the lithium battery based on the acquired battery data comprises:

obtaining a battery capacity and a charging/discharging time of the cell before SOC correction from the BMS; and calculating an SOC correction value of the cell by using the following formula:

$$\Delta SOC=(1/C_{packbefore}-1/C_{packnow})\int_0^t Idt,$$

wherein $\Delta SOC$ represents the SOC correction value of the cell; $C_{packbefore}$ represents the battery capacity of the cell before the SOC correction; $C_{packnow}$ represents the present capacity of the cell; t represents the charging/discharging time of the cell; and I represents a current generated by the cell during charging/discharging.

7. The system according to claim 6, EMS, wherein the EMS being configured to calculate a self-discharge parameter of each cell by using the battery data comprises:
   acquiring a charging beginning moment, a charging ending moment, the present capacity of said each cell, and an SOC value at the beginning of charging;
   calculating an SOC value of the cell at the charging ending moment by using the following formula:

$$SOC_{i,now} = SOC_{i,initial} + \int_{t_{i,begin}}^{t_{i,end}} I dt / Q_{imax},$$

wherein $SOC_{i,now}$ represents the SOC value of an $i^{th}$ cell at the charging ending moment; $Q_{imax}$ represents the present capacity of the $i^{th}$ cell; $SOC_{i,initial}$ represents the SOC value of the $i^{th}$ cell at the beginning of the charging; $t_{i,begin}$ represents the charging beginning moment of the $i^{th}$ cell; and $t_{i,end}$ represents the charging ending moment of the $i^{th}$ cell;

calculating a charge capacity of said each cell by using the following formula:

$$C_{i,charge} = \int_{t_{i,begin}}^{t_{i,end}} I dt + (1 - SOC_{i,now}) * Q_{imax},$$

wherein $C_{i,charge}$ represents the charge capacity of the $i^{th}$ cell;

determining a shortest charging time for fully charging the cell according to the charging beginning moment and the charging ending moment of said each cell; and calculating the self-discharge parameter of said each cell by using the following formula:

$$t_{i,full} = C_{i,charge} / I$$

$$\Delta t_i = t_{i,full} - t_{min},$$

wherein $t_{i,full}$ represents the charging time for fully charging the $i^{th}$ cell; $t_{min}$ represents a smallest one of times for fully charging all of the cells; and $\Delta t_i$ represents the self-discharge parameter of the $i^{th}$ cell.

* * * * *